US012095996B2

(12) United States Patent
Bossen

(10) Patent No.: US 12,095,996 B2
(45) Date of Patent: *Sep. 17, 2024

(54) SYSTEMS AND METHODS FOR PERFORMING BINARY ARITHMETIC CODING IN VIDEO CODING

(71) Applicants: SHARP KABUSHIKI KAISHA, Osaka (JP); FG Innovation Company Limited, Tuen Mun (HK)

(72) Inventor: Frank Bossen, Vancouver, WA (US)

(73) Assignees: SHARP KABUSHIKI KAISHA, Sakai (JP); FG Innovation Company Limited, Tuen Mun (HK)

( * ) Notice: Subject to any disclaimer, the term of this patent is extended or adjusted under 35 U.S.C. 154(b) by 0 days.

This patent is subject to a terminal disclaimer.

(21) Appl. No.: 17/947,479

(22) Filed: Sep. 19, 2022

(65) Prior Publication Data
US 2023/0024560 A1 Jan. 26, 2023

Related U.S. Application Data

(63) Continuation of application No. 17/050,442, filed as application No. PCT/JP2019/018292 on May 7, 2019, now Pat. No. 11,503,299.
(Continued)

(51) Int. Cl.
H04N 19/13 (2014.01)
(52) U.S. Cl.
CPC .................. H04N 19/13 (2014.11)
(58) Field of Classification Search
CPC ....... H04N 19/13; H04N 19/176; H04N 19/91
See application file for complete search history.

(56) References Cited

U.S. PATENT DOCUMENTS 1,932,843 A  10/1933 Dean et al.
6,900,748 B2 * 5/2005 Marpe .................... H04N 19/61
                                                        341/51
(Continued)

FOREIGN PATENT DOCUMENTS

AU    2011247855 A1    5/2013
CN      1672147 A  *  9/2005  ........... G06F 17/148
(Continued)

OTHER PUBLICATIONS

Alexander Alshin "High Precision Probability Estimation For CABAC," 2013 Visual Communications and Image Processing (VCIP), Nov. 17-20, 2013, 6 pages, IEEE, Kuching, Malaysia (Year: 2013).*
(Continued)

Primary Examiner — Dramos Kalapodas
(74) Attorney, Agent, or Firm — ScienBiziP, P.C.

(57) ABSTRACT

A method for subdividing an interval during entropy decoding for a bitstream representing a set of video pictures is provided. A sub-interval value is computed by (i) performing an initial right bit-shifting operation on a probability estimator value to reduce a length in bits of the probability estimator value, (ii) multiplying the right bit-shifted probability estimator value by a range value representing the interval, (iii) performing another right bit-shifting operation on a result of the multiplication, and (iv) adding a constant value to a result of the other right bit-shifting operation, wherein the probability estimator value is associated with a probability of a bin having a particular value. The sub-interval value computed based on the right bit-shifted probability estimator value is used to update the interval.

20 Claims, 8 Drawing Sheets

Related U.S. Application Data

(60) Provisional application No. 62/692,327, filed on Jun. 29, 2018, provisional application No. 62/669,928, filed on May 10, 2018.

(56) References Cited

U.S. PATENT DOCUMENTS

| | | | | |
|---|---|---|---|---|
| 7,286,710 | B2 * | 10/2007 | Marpe | H04N 19/196 |
| | | | | 341/51 |
| 7,370,608 | B1 | 5/2008 | Friedman | |
| 7,684,484 | B2 | 3/2010 | Marpe et al. | |
| 10,129,546 | B2 * | 11/2018 | Sze | H04N 19/13 |
| 2007/0116371 | A1 | 5/2007 | Kimura | |
| 2008/0118169 | A1 | 5/2008 | Sohm et al. | |
| 2008/0240597 | A1 | 10/2008 | He et al. | |
| 2013/0027230 | A1 * | 1/2013 | Marpe | H04N 19/91 |
| | | | | 341/107 |
| 2018/0139445 | A1 * | 5/2018 | Chuang | H04N 19/423 |
| 2018/0199046 | A1 | 7/2018 | Chuang et al. | |

FOREIGN PATENT DOCUMENTS

| | | | | | |
|---|---|---|---|---|---|
| CN | 1675842 | A | * | 9/2005 | ........... H03M 13/07 |
| CN | 1703089 | A | * | 11/2005 | |
| CN | 101167368 | B | * | 3/2012 | ......... H03M 7/4006 |
| CN | 103119849 | A | * | 5/2013 | ......... H03M 7/4006 |
| JP | 2007142823 | A | * | 6/2007 | ........... H04N 19/124 |
| WO | 03100655 | A1 | | 12/2003 | |

OTHER PUBLICATIONS

Non-Final Rejection dated Sep. 10, 2021 for U.S. Appl. No. 17/050,442 which is the parent application of the instant application.

Non-Final Rejection dated Jan. 31, 2022 for U.S. Appl. No. 17/050,442 which is the parent application of the instant application.

Notice of Allowance dated Jul. 11, 2022 for U.S. Appl. No. 17/050,442 which is the parent application of the instant application.

International Standard, ISO/IEC 14496-2, Information technology—Coding of audio-visual objects—Part 2: Visual, Second edition Dec. 1, 2001.

* cited by examiner

SYSTEMS AND METHODS FOR PERFORMING BINARY ARITHMETIC CODING IN VIDEO CODING

CROSS-REFERENCE TO RELATED APPLICATION(S)

This application is a continuation application of U.S. patent application Ser. No. 17/050,442, filed on Oct. 24, 2020, which is a National Stage application of International Application Serial No. PCT/JP2019/018292, filed on May 7, 2019, which claims the benefit of and priority to U.S. Provisional Patent Application Ser. No. 62/669,928, filed on May 10, 2018, and U.S. Provisional Patent Application Ser. No. 62/692,327, filed on Jun. 29, 2018. The contents of all of the above-mentioned applications are hereby fully incorporated herein by reference in their entirety.

FIELD

This disclosure relates to video coding and, more particularly, to techniques for performing binary arithmetic coding.

BACKGROUND

Digital video capabilities can be incorporated into a wide range of devices, including digital televisions, laptop or desktop computers, tablet computers, digital recording devices, digital media players, video gaming devices, cellular telephones, including so-called smartphones, medical imaging devices, and the like. Digital video may be coded according to a video coding standard. Video coding standards may incorporate video compression techniques. Examples of video coding standards include ISO/IEC MPEG-4 Visual and ITU-T H.264 (also known as ISO/IEC MPEG-4 AVC) and High-Efficiency Video Coding (HEVC). HEVC is described in High Efficiency Video Coding (HEVC), Rec. ITU-T H.265, December 2016, which is incorporated by reference, and referred to herein as ITU-T H.265. Extensions and improvements for ITU-T H.265 are currently being considered for the development of next generation video coding standards. For example, the ITU-T Video Coding Experts Group (VCEG) and ISO/IEC (Moving Picture Experts Group (MPEG) (collectively referred to as the Joint Video Exploration Team (WET)) are studying the potential need for standardization of future video coding technology with a compression capability that significantly exceeds that of the current HEVC standard. The Joint Exploration Model 7 (JEM 7), Algorithm Description of Joint Exploration Test Model 7 (JEM 7), ISO/IEC JTC1/SC29/WG11 Document: JVET-G1001, July 2017, Torino, IT, which is incorporated by reference herein, describes the coding features that are under coordinated test model study by the JVET as potentially enhancing video coding technology beyond the capabilities of ITU-T H.265. It should be noted that the coding features of JEM 7 are implemented in JEM reference software. As used herein, the term JEM may collectively refer to algorithms included in JEM 7 and implementations of JEM reference software.

Video compression techniques enable data requirements for storing and transmitting video data to be reduced. Video compression techniques may reduce data requirements by exploiting the inherent redundancies in a video sequence. Video compression techniques may sub-divide a video sequence into successively smaller portions (e.g., groups of frames within a video sequence, a frame within a group of frames, slices within a frame, coding tree units (e.g., macroblocks) within a slice, coding blocks within a coding tree unit, etc.). Intra prediction coding techniques (e.g., intra-picture (spatial)) and inter prediction techniques (e.g., inter-picture (temporal)) may be used to generate difference values between a unit of video data to be coded and a reference unit of video data. The difference values may be referred to as residual data. Residual data may be coded as quantized transform coefficients. Syntax elements may relate residual data and a reference coding unit (e.g., intra-prediction mode indices, motion vectors, and block vectors). Residual data and syntax elements may be entropy coded. Entropy encoded residual data and syntax elements may be included in a compliant bitstream.

SUMMARY

In a first aspect of the present disclosure, a method comprises determining whether a bin value is equal to a least probable state; and updating a probability estimate by conditionally adding $2^{N-d}$ to the probability estimate in the case where the bin value is equal to the least probable state, wherein N is the width in bits of the probability estimate and d is a parameter which controls the probability updating speed.

In a second aspect of the present disclosure, a method for subdividing an interval during entropy decoding for a bitstream representing a set of video pictures and an electronic device for performing the method are provided. The method includes computing a sub-interval value by (i) performing an initial right bit-shifting operation on a probability estimator value to reduce a length in bits of the probability estimator value, (ii) multiplying the right bit-shifted probability estimator value by a range value representing the interval, (iii) performing another right bit-shifting operation on a result of the multiplication, and (iv) adding a constant value to a result of the other right bit-shifting operation, wherein the probability estimator value is associated with a probability of a bin having a particular value; and using the sub-interval value computed based on the right bit-shifted probability estimator value to update the interval.

In an implementation of the second aspect, an amount by which the result of the multiplication is right bit-shifted in the other right bit-shifting operation is based on an amount by which the probability estimator value is right bit-shifted in the initial right bit-shifting operation.

In another implementation of the second aspect, the amount by which the result of the multiplication is right bit-shifted is equal to a constant minus the amount by which the probability estimator value is right bit-shifted.

In another implementation of the second aspect, the probability estimator value is associated with a current bin value being equal to a least probable state for the current bin value.

In another implementation of the second aspect, 1 minus the probability estimator value is right bit-shifted and multiplied by the range value representing the interval when the current bin value is equal to a most probable state for the current bin value.

In another implementation of the second aspect, the method further includes updating the probability estimator value based on a current bin value.

In another implementation of the second aspect, updating the probability estimator value includes applying a bit-shifting operation to a value based on the probability estimator value.

In another implementation of the second aspect, if the updated probability estimator value exceeds a threshold, a most probable state for a subsequent bin value is modified.

In another implementation of the second aspect, if the most probable state for the subsequent bin value is modified, the updated probability estimator value is also modified.

In another implementation of the second aspect, the updated probability estimator value is modified by inverting each of the bits of the updated probability estimator value.

An implementation of the second aspect further includes determining whether the updated interval is smaller than a threshold value; and when the updated interval is smaller than the threshold value, renormalizing the updated interval.

In another implementation of the second aspect, renormalizing the updated interval includes doubling the updated interval.

DETAILED DESCRIPTION

Figure 1:
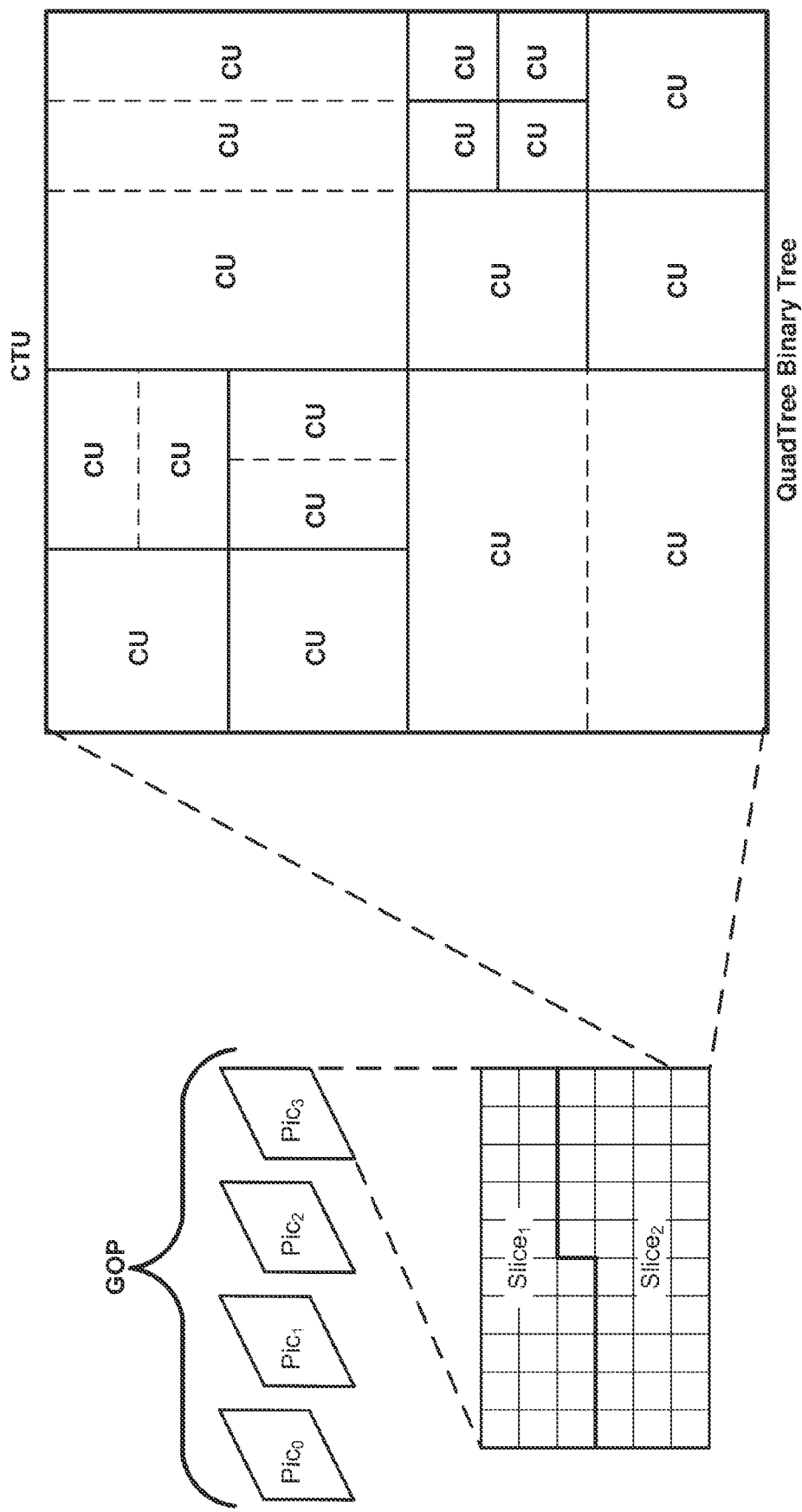
FIG. 1 is a conceptual diagram illustrating an example of a group of pictures coded according to a quad tree binary tree partitioning in accordance with an example implementation of the present disclosure.

In general, this disclosure describes various techniques for coding video data. In particular, this disclosure describes techniques for performing binary arithmetic coding. It should be noted that although techniques of this disclosure are described with respect to ITU-T H.264, ITU-T H.265, and JEM, the techniques of this disclosure are generally applicable to video coding. For example, the coding techniques described herein may be incorporated into video coding systems, (including video coding systems based on future video coding standards) including block structures, intra prediction techniques, inter prediction techniques, transform techniques, filtering techniques, and/or entropy coding techniques other than those included in ITU-T H.265 and JEM. Thus, reference to ITU-T H.264, ITU-T H.265, and/or JEM is for descriptive purposes and should not be construed to limit the scope of the techniques described herein. Further, it should be noted that incorporation by reference of documents herein is for descriptive purposes and should not be construed to limit or create ambiguity with respect to terms used herein. For example, in the case where an incorporated reference provides a different definition of a term than another incorporated reference and/or as the term is used herein, the term should be interpreted in a manner that broadly includes each respective definition and/or in a manner that includes each of the particular definitions in the alternative.

In one example, a device includes one or more processors configured to determine a determine whether a bin value is equal to a least probable state; and update a probability estimate by conditionally adding $2N-d$ to the probability estimate in the case where the bin value is equal to the least probable state, wherein N is the width in bits of the probability estimate and d is a parameter which controls the probability updating speed.

In one example, a non-transitory computer-readable storage medium includes instructions stored thereon that, when executed, cause one or more processors of a device to determine whether a bin value is equal to a least probable state; and update a probability estimate by conditionally adding $2N-d$ to the probability estimate in the case where the bin value is equal to the least probable state, wherein N is the width in bits of the probability estimate and d is a parameter which controls the probability updating speed.

In one example, an apparatus includes means for determining whether a bin value is equal to a least probable state; and means for updating a probability estimate by conditionally adding $2N-d$ to the probability estimate in the case where the bin value is equal to the least probable state, wherein N is the width in bits of the probability estimate and d is a parameter which controls the probability updating speed.

The details of one or more examples are set forth in the accompanying drawings and the description below. Other features, objects, and advantages will be apparent from the description and drawings, and from the claims.

Video content typically includes video sequences including a series of frames (or pictures). A series of frames may also be referred to as a group of pictures (GOP). Each video frame or picture may include a plurality of slices or tiles, where a slice or tile includes a plurality of video blocks. As used herein, the term video block may generally refer to an area of a picture or may more specifically refer to the largest array of sample values that may be predictively coded, sub-divisions thereof, and/or corresponding structures. Further, the term current video block may refer to an area of a picture being encoded or decoded. A video block may be defined as an array of sample values that may be predictively coded. It should be noted that in some cases pixel values may be described as including sample values for respective components of video data, which may also be referred to as color components, (e.g., luma (Y) and chroma (Cb and Cr) components, or red, green, and blue components). It should be noted that in some cases, the terms pixel value and sample value are used interchangeably. Video blocks may be ordered within a picture according to a scan pattern (e.g., a raster scan). A video encoder may perform predictive encoding on video blocks and sub-divisions thereof. Video blocks and sub-divisions thereof may be referred to as nodes.

A video sampling format, which may also be referred to as a chroma format, may define the number of chroma samples included in a coding unit (CU) with respect to the number of luma samples included in a CU. For example, for the 4:2:0 sampling format, the sampling rate for the luma component is twice that of the chroma components for both the horizontal and vertical directions. As a result, for a CU formatted according to the 4:2:0 format, the width and height of an array of samples for the luma component are twice that of each array of samples for the chroma components. As described above, a CU is typically defined according to the number of horizontal and vertical luma samples. For a CU formatted according to the 4:2:2 format, the width of an array of samples for the luma component is twice that of the width of an array of samples for each chroma component, but the height of the array of samples for the luma component is equal to the height of an array of samples for each chroma component. Further, for a CU formatted according to the 4:4:4 format, an array of samples for the luma component has the same width and height as an array of samples for each chroma component.

ITU-T H.264 specifies a macroblock including 16×16 luma samples. That is, in ITU-T H.264, a picture is segmented into macroblocks. ITU-T H.265 specifies an analogous Coding Tree Unit (CTU) structure (which may be referred to as a largest coding unit (LCU)). In ITU-T H.265, pictures are segmented into CTUs. In ITU-T H.265, for a picture, a CTU size may be set as including 16×16, 32×32, or 64×64 luma samples. In ITU-T H.265, a CTU is composed of respective Coding Tree Blocks (CTB) for each component of video data (e.g., luma (Y) and chroma (Cb and Cr)). It should be noted that video having one luma component and the two corresponding chroma components may be described as having two channels, e.g., a luma channel and a chroma channel. Further, in ITU-T H.265, a CTU may be partitioned according to a quadtree (QT) partitioning structure, which results in the CTBs of the CTU being partitioned into Coding Blocks (CB). That is, in ITU-T H.265, a CTU may be partitioned into quadtree leaf nodes. According to ITU-T H.265, one luma CB together with two corresponding chroma CBs and associated syntax elements are referred to as a coding unit (CU). In ITU-T H.265, a minimum allowed size of a CB may be signaled. In ITU-T H.265, the smallest minimum allowed size of a luma CB is 8×8 luma samples. In ITU-T H.265, the decision to code a picture area using intra prediction or inter prediction is made at the CU level.

In ITU-T H.265, a CU is associated with a prediction unit (PU) structure having its root at the CU. In ITU-T H.265, PU structures allow luma and chroma CBs to be split for purposes of generating corresponding reference samples. That is, in ITU-T H.265, luma and chroma CBs may be split into respective luma and chroma prediction blocks (PBs), where a PB includes a block of sample values for which the same prediction is applied. In ITU-T H.265, a CB may be partitioned into 1, 2, or 4 PBs. ITU-T H.265 supports PB sizes from 64×64 samples down to 4×4 samples. In ITU-T H.265, square PBs are supported for intra prediction, where a CB may form the PB or the CB may be split into four square PBs (e.g., intra prediction PB types include M×M or M/2×M/2, where M is the height and width of the square CB). In ITU-T H.265, in addition to the square PBs, rectangular PBs are supported for inter prediction, where a CB may by halved vertically or horizontally to form PBs (e.g., inter prediction PB types include M×M, M/2×M/2, M/2×M, or M×M/2). Further, it should be noted that in ITU-T H.265, for inter prediction, four asymmetric PB partitions are supported, where the CB is partitioned into two PBs at one quarter of the height (at the top or the bottom) or width (at the left or the right) of the CB (e.g., asymmetric partitions include M/4×M left, M/4×M right, M×M/4 top, and M×M/4 bottom). Intra prediction data (e.g., intra prediction mode syntax elements) or inter prediction data (e.g., motion data syntax elements) corresponding to a PB is used to produce reference and/or predicted sample values for the PB.

JEM specifies a CTU having a maximum size of 256×256 luma samples. JEM specifies a quadtree plus binary tree (QTBT) block structure. In JEM, the QTBT structure enables quadtree leaf nodes to be further partitioned by a binary tree (BT) structure. That is, in JEM, the binary tree structure enables quadtree leaf nodes to be recursively divided vertically or horizontally. FIG. 1 is a conceptual diagram illustrating an example of a CTU (e.g., a CTU having a size of 256×256 luma samples) being partitioned into quadtree leaf nodes and quadtree leaf nodes being further partitioned according to a binary tree. That is, in FIG. 1 dashed lines indicate additional binary tree partitions in a quadtree. Thus, the binary tree structure in JEM enables square and rectangular leaf nodes, where each leaf node includes a CB. As illustrated in FIG. 1, a picture included in a GOP may include slices, where each slice includes a sequence of CTUs and each CTU may be partitioned according to a QTBT structure. FIG. 1 illustrates an example of QTBT partitioning for one CTU included in a slice. In JEM, CBs are used for prediction without any further partitioning. That is, in JEM, a CB may be a block of sample values on which the same prediction is applied. Thus, a JEM QTBT leaf node may be analogous to a PB in ITU-T H.265.

For intra prediction coding, an intra prediction mode may specify the location of reference samples within a picture. In ITU-T H.265, defined possible intra prediction modes include a planar (e.g., surface fitting) prediction mode (predMode: 0), a DC (e.g., flat overall averaging) prediction mode (predMode: 1), and 33 angular prediction modes (predMode: 2-34). In JEM, defined possible intra-prediction modes include a planar prediction mode (predMode: 0), a DC prediction mode (predMode: 1), and 65 angular prediction modes (predMode: 2-66). It should be noted that planar and DC prediction modes may be referred to as non-directional prediction modes and that angular prediction modes may be referred to as directional prediction modes. It should be noted that the techniques described herein may be generally applicable regardless of the number of defined possible prediction modes.

For inter prediction coding, a motion vector (MV) identifies reference samples in a picture other than the picture of a video block to be coded and thereby exploits temporal redundancy in video. For example, a current video block may be predicted from reference block(s) located in previously coded frame(s), and a motion vector may be used to indicate the location of the reference block. A motion vector and associated data may describe, for example, a horizontal component of the motion vector, a vertical component of the motion vector, a resolution for the motion vector (e.g., one-quarter pixel precision, one-half pixel precision, one-pixel precision, two-pixel precision, four-pixel precision), a prediction direction, and/or a reference picture index value. Further, a coding standard, such as, for example, ITU-T H.265, may support motion vector prediction. Motion vector prediction enables a motion vector to be specified using motion vectors of neighboring blocks. Examples of motion vector prediction include advanced motion vector prediction (AMVP), temporal motion vector prediction (TMVP), so-called "merge" mode, and "skip" and "direct" motion inference. Further, JEM supports advanced temporal motion vector prediction (ATMVP) and Spatial-temporal motion vector prediction (STMVP).

As described above, intra prediction data or inter prediction data is used to produce reference sample values for a block of sample values. The difference between sample values included in a current PB, or another type of picture area structure, and associated reference samples (e.g., those generated using a prediction) may be referred to as residual data. Residual data may include respective arrays of difference values corresponding to each component of video data. Residual data may be in the pixel domain. A transform, such as a discrete cosine transform (DCT), a discrete sine transform (DST), an integer transform, a wavelet transform, or a conceptually similar transform, may be applied to an array of difference values to generate transform coefficients. In some cases, a transform process may include rotation, and/or performance of one or more one dimensional transforms. It should be noted that in ITU-T H.265, a CU is associated with a transform unit (TU) structure having its root at the CU level. That is, in ITU-T H.265, an array of difference values may be sub-divided for purposes of generating transform coefficients (e.g., four 8×8 transforms may be applied to a 16×16 array of residual values). For each component of video data, such sub-divisions of difference values may be referred to as Transform Blocks (TBs). It should be noted that in ITU-T H.265, TBs are not necessarily aligned with PBs. Further, it should be noted that in ITU-T H.265, TBs may have the following sizes: 4×4, 8×8, 16×16, and 32×32.

It should be noted that in JEM, residual values corresponding to a CB are used to generate transform coefficients without further partitioning. That is, in JEM a QTBT leaf node may be analogous to both a PB and a TB in ITU-T H.265. It should be noted that in JEM, a core transform and a subsequent secondary transform may be applied (in the video encoder) to generate transform coefficients. For a video decoder, the order of transforms is reversed. Further, in JEM, whether a secondary transform is applied to generate transform coefficients may be dependent on a prediction mode.

A quantization process may be performed on transform coefficients or residual sample values directly, e.g., in the case of palette coding quantization. Quantization approximates transform coefficients by amplitudes restricted to a set of specified values. Quantization essentially scales transform coefficients in order to vary the amount of data required to represent a group of transform coefficients. Quantization may include division of transform coefficients (or resulting values of addition of an offset value to transform coefficients) by a quantization scaling factor and any associated rounding functions (e.g., rounding to the nearest integer). Quantized transform coefficients may be referred to as coefficient level values. Inverse quantization (or "dequantization") may include multiplication of coefficient level values by the quantization scaling factor, and any reciprocal rounding or offset addition operations. It should be noted that as used herein the term "quantization process" in some instances may refer to division by a scaling factor to generate level values and multiplication by a scaling factor to recover transform coefficients in some instances. That is, a quantization process may refer to quantization in some cases and inverse quantization in some cases. Further, it should be noted that although in some of the examples below quantization processes are described with respect to arithmetic operations associated with decimal notation, such descriptions are for illustrative purposes and should not be construed as limiting. For example, the techniques described herein may be implemented in a device using binary operations and the like. For example, multiplication and division operations described herein may be implemented using bit shifting operations and the like.

With respect to the equations used herein, the following arithmetic operators may be used:

+ Addition
− Subtraction
* Multiplication, including matrix multiplication
$X^y$ Exponentiation. Specifies x to the power of y. In other contexts, such notation is used for superscripting not intended for interpretation as exponentiation.
/ Integer division with truncation of the result toward zero. For example, 7/4 and −7/−4 are truncated to 1 and −7/4 and 7/−4 are truncated to −1.
÷ Used to denote division in mathematical equations where no truncation or rounding is intended $$\frac{x}{y}$$

Used to denote division in mathematical equations where no truncation or rounding is intended.
x % y Modulus. Remainder of x divided by y, defined only for integers x and y with x>=0 and y>0.

Further, the following logical operators may be used:
x&&y Boolean logical "and" of x and y
x||y Boolean logical "or" of x and y
! Boolean logical "not"
x?y:z If x is TRUE or not equal to 0, evaluates to the value of y; otherwise, evaluates to the value of z.

Further, the following relational operators may be used:
> Greater than
>= Greater than or equal to
< Less than
<= Less than or equal to
== Equal to
!= Not equal to Further, the following bit-wise operators may be used:
& Bit-wise "and". When operating on integer arguments, operates on a two's complement representation of the integer value. When operating on a binary argument that contains fewer bits than another argument, the shorter argument is extended by adding more significant bits equal to 0.
| Bit-wise "or". When operating on integer arguments, operates on a two's complement representation of the integer value. When operating on a binary argument that contains fewer bits than another argument, the shorter argument is extended by adding more significant bits equal to 0.
^ Bit-wise "exclusive or". When operating on integer arguments, operates on a two's complement representation of the integer value. When operating on a binary argument that contains fewer bits than another argument, the shorter argument is extended by adding more significant bits equal to 0.
x>>y Arithmetic right shift of a two's complement integer representation of x by y binary digits. This function is defined only for non-negative integer values of y. Bits shifted into the most significant bits (MSBs) as a result of the right shift have a value equal to the MSB of x prior to the shift operation.
x<<y Arithmetic left shift of a two's complement integer representation of x by y binary digits. This function is defined only for non-negative integer values of y. Bits shifted into the least significant bits (LSBs) as a result of the left shift have a value equal to 0.

Figure 2A:
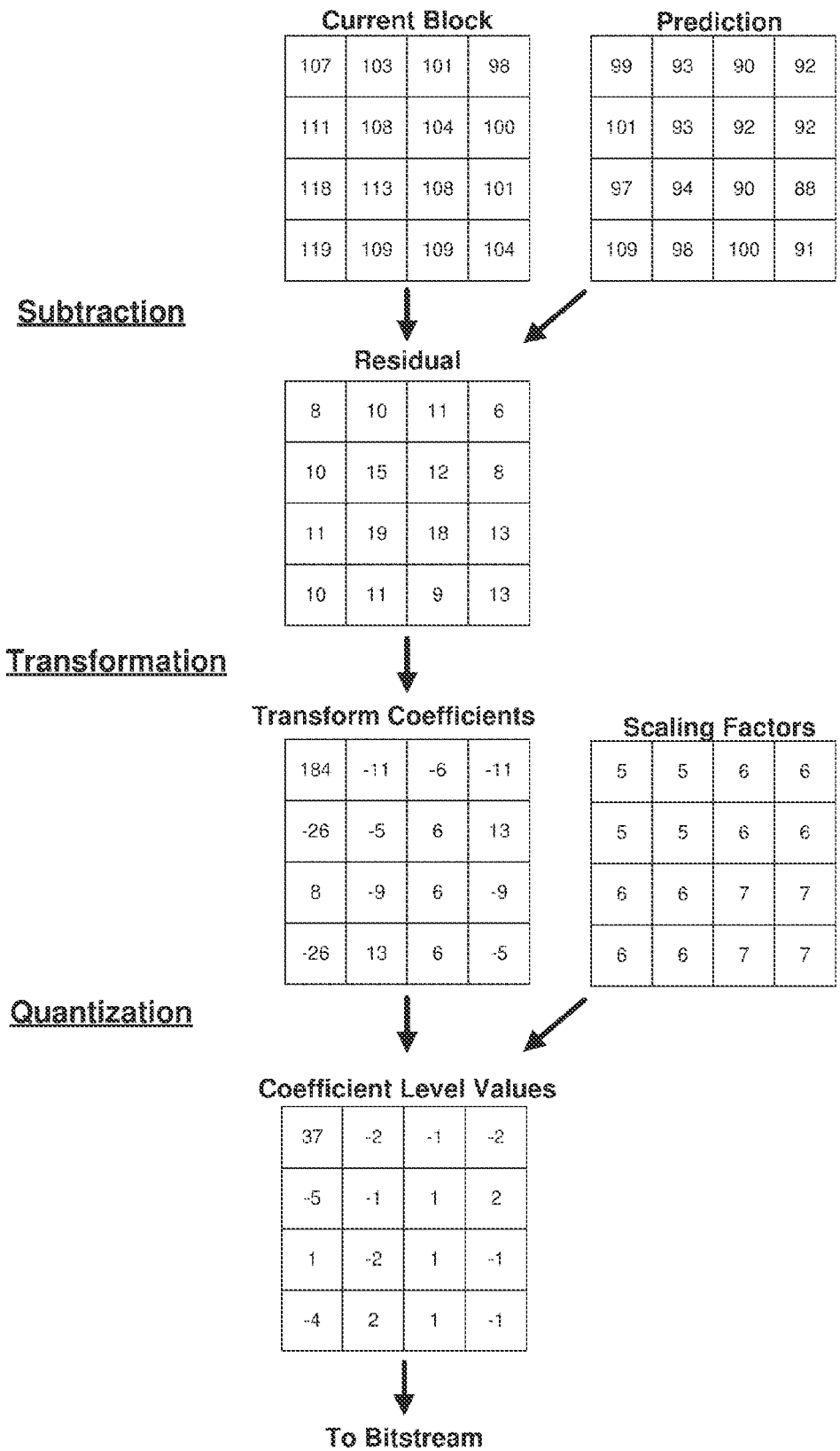
FIG. 2A is a conceptual diagram illustrating examples of coding a block of video data in accordance with an example implementation of the present disclosure.
Figure 2B:
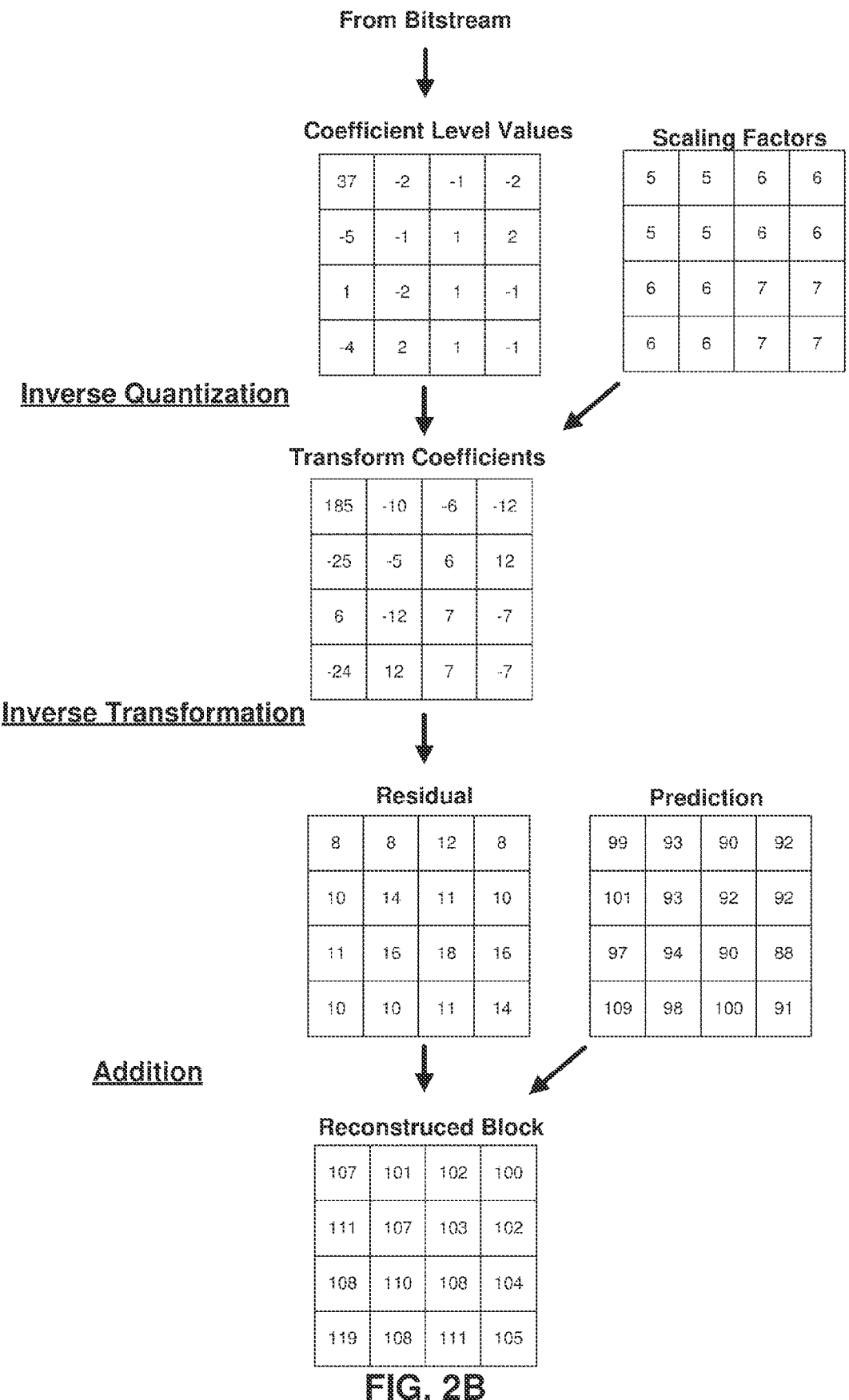
FIG. 2B is a conceptual diagram illustrating examples of coding a block of video data in accordance with an example implementation of the present disclosure.

FIGS. 2A-2B are conceptual diagrams illustrating examples of coding a block of video data in accordance with an example implementation of the present disclosure. As illustrated in FIG. 2A, a current block of video data (e.g., a CB corresponding to a video component) is encoded by generating a residual by subtracting a set of prediction values from the current block of video data, performing a transformation on the residual, and quantizing the transform coefficients to generate level values. As illustrated in FIG. 2B, the current block of video data is decoded by performing inverse quantization on level values, performing an inverse transform, and adding a set of prediction values to the resulting residual. It should be noted that in the examples in FIGS. 2A-2B, the sample values of the reconstructed block differ from the sample values of the current video block that is encoded. In this manner, coding may be said to be lossy. However, the difference in sample values may be considered acceptable or imperceptible to a viewer of the reconstructed video.

Further, as illustrated in FIGS. 2A-2B, coefficient level values are generated using an array of scaling factors. In ITU-T H.265, an array of scaling factors is generated by selecting a scaling matrix and multiplying each entry in the scaling matrix by a quantization scaling factor. In ITU-T H.265, a scaling matrix is selected based in part on a prediction mode and a color component, where scaling matrices of the following sizes are defined: 4×4, 8×8, 16×16, and 32×32. It should be noted that in some examples, a scaling matrix may provide the same value for each entry (e.g., all coefficients are scaled according to a single value). In ITU-T H.265, the value of a quantization scaling factor may be determined by a quantization parameter, QP. In ITU-T H.265, for a bit-depth of 8-bits, the QP can take 52 values from 0 to 51 and a change of 1 for QP generally corresponds to a change in the value of the quantization scaling factor by approximately 12%. Further, in ITU-T H.265, a QP value for a set of transform coefficients may be derived using a predictive quantization parameter value (which may be referred to as a predictive QP value or a QP predictive value) and an optionally signaled quantization parameter delta value (which may be referred to as a QP delta value or a delta QP value). In ITU-T H.265, a quantization parameter may be updated for each CU and a respective quantization parameter may be derived for each of the luma and chroma channels.

Referring again to FIG. 2A, quantized transform coefficients are coded into a bitstream. Quantized transform coefficients and syntax elements (e.g., syntax elements indicating a coding structure for a video block) may be entropy coded according to an entropy coding technique. An entropy coding process includes coding values of syntax elements using lossless data compression algorithms. Examples of entropy coding techniques include content adaptive variable length coding (CAVLC), context adaptive binary arithmetic coding (CABAC), probability interval partitioning entropy coding (PIPE), and the like. Entropy encoded quantized transform coefficients and corresponding entropy encoded syntax elements may form a compliant bitstream that can be used to reproduce video data at a video decoder. An entropy coding process, for example, CABAC, may include performing a binarization on syntax elements. Binarization refers to the process of converting a value of a syntax element into a series of one or more bits. These bits may be referred to as "bins." Binarization may include one or a combination of the following coding techniques: fixed length coding, unary coding, truncated unary coding, truncated Rice coding, Golomb coding, k-th order exponential Golomb coding, and Golomb-Rice coding. For example, binarization may include representing the integer value of 5 for a syntax element as 00000101 using an 8-bit fixed length binarization technique or representing the integer value of 5 as 11110 using a unary coding binarization technique. As used herein, each of the terms fixed length coding, unary coding, truncated unary coding, truncated Rice coding, Golomb coding, k-th order exponential Golomb coding, and Golomb-Rice coding may refer to general implementations of these techniques and/or more specific implementations of these coding techniques. For example, a Golomb-Rice coding implementation may be specifically defined according to a video coding standard, for example, ITU-T H.265.

In the example of CABAC in ITU-T H.265, for a particular bin, a context model is used to determine a context index for the bin. A context model is essential a probability state model for a bin and a context index provides a most probable state (MPS) value for the bin (e.g., an MPS for a bin is one of 0 or 1) and a probability value of the bin being the MPS and/or least probable state (LPS) at a given state of arithmetic coding. For example, a context index may indicate, at a current state, that the MPS of a bin is 0 and the probability of the bin being 1 (e.g., the LPS) is 0.3. It should be noted that a context model may be selected based on values of previously coded syntax elements. For example, values of syntax elements associated with neighboring video blocks may be used to determine a context model associated with a syntax element corresponding to a current video block.

Binary arithmetic coding codes a series of 0's and 1's based on the principle of recursive interval subdivision. Essentially, for a binary string $(b_1, \ldots, b_N)$, for an interval having an initial width (range) $R_0$, for $(b_1, \ldots, b_N)$, $R_0$ is recursively divided as follows:

For i=(1, ..., N),
if $b_i$ equals LPS:
$R_i = pLPS_i * R_{i-1}$,
otherwise
$R_i = R_{i-1} - pLPS_i * R_{r-1}$,
Where,
LPS is the value of the least probably symbol, and
$pLPS_i$ is the estimated probability of $b_i$ being the LPS.

As illustrated above, $R_i$ is determined based on whether the observed value of $b_i$ is the MPS or LPS. For example, for $b_1$ if $R_0$ is 512, the LPS is 0, and $pLPS_1 * R_0$ is 158, if $b_1$ is observed to be 1, $R_1$=354 and if $b_1$ is observed to be 0, $R_1$=158. In ITU-T H.265, a context index provides an MPS value for a bin and a probability value of the bin being the LPS, where the probability value of the bin being the LPS (e.g., pLPS) is indicated by one of 64 probability states. In particular, in ITU-T H.265, a probability state index variable, pStateIdx, is indexed such that pStateIdx=0 corresponds to a maximum LPS probability value, and decreasing LPS probabilities are indexed to higher values of pStateIdx. Further, in ITU-T H.265, $R_0$ is 512, which can be represented by 9-bits. However, $R_i$ is quantized to a set {Q1, ..., Q4} such that all possible values of $pLPS_i * R_{i-1}$ are pre-computed and indexed according to a 64×4 look-up table.

During encoding, after an interval for $R_i$ is determined, e.g., based on $pLPS_i$ and the observed value of a renormalization process occurs. A renormalization process essentially determines whether bits are output (e.g., written to a bitstream) based on the value of $R_i$. Essentially, in renormalization, if $R_i$ falls below a threshold value, $R_i$ is doubled and a bit value may be output. For example, in encoder side renormalization process described in ITU-T H.265, a determination is made if $R_i$ is less than 256. If $R_i$ is not less than 256, no bits are written to the bitstream and $R_{i+1}$ is computed for $b_{i+1}$, using $R_i$. If $R_i$ is less than 256, a 0-bit, a 1-bit, or no bit is conditionally written to the bitstream based on the lower end of the sub-interval, $R_i$ is doubled, and $R_{i+1}$ is computed for $b_{i+1}$ (e.g., based on the doubled value of $R_i$). A binary decoder receiving the output bits (e.g., the arithmetic code) recovers the binary string $(b_1, \ldots, b_N)$ by performing the same interval sub-division at each $b_i$ as an encoder and by comparing subsets of the arithmetic code to $R_i$ values.

In ITU-T H.265, the observed value of a bin is used to update the context index. ITU-T H.265 provides the following with respect to updating the context index based on the determined value of the bin:

```
if( binVal = = valMps )
    pStateIdx = transIdxMps(pStateIdx)
else {
    if( pStateIdx = = 0 )
        valMps = 1 – valMps
    pStateIdx = transIdxLps( pStateIdx )
}
```

Where,
valMps is the value of the MPS for the bin; and
transIdxMps( ) and transIdxLps( ) are a defined set of transition rules as provided in Table 1.

TABLE 1

| pStateIdx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| transIdxLps | 0 | 0 | 1 | 2 | 2 | 4 | 4 | 5 | 6 | 7 | 8 | 9 | 9 | 11 | 11 | 12 |
| transIdxMps | 1 | 2 | 3 | 4 | 5 | 6 | 7 | 8 | 9 | 10 | 11 | 12 | 13 | 14 | 15 | 16 |
| pStateIdx | 16 | 17 | 18 | 19 | 20 | 21 | 22 | 23 | 24 | 25 | 26 | 27 | 28 | 29 | 30 | 31 |
| transIdxLps | 13 | 13 | 15 | 15 | 16 | 16 | 18 | 18 | 19 | 19 | 21 | 21 | 22 | 22 | 23 | 24 |
| transIdxMps | 17 | 18 | 19 | 20 | 21 | 22 | 23 | 24 | 25 | 26 | 27 | 28 | 29 | 30 | 31 | 32 |
| pStateIdx | 32 | 33 | 34 | 35 | 36 | 37 | 38 | 39 | 40 | 41 | 42 | 43 | 44 | 45 | 46 | 47 |
| transIdxLps | 24 | 25 | 26 | 26 | 27 | 27 | 28 | 29 | 29 | 30 | 30 | 30 | 31 | 32 | 32 | 33 |
| transIdxMps | 33 | 34 | 35 | 36 | 37 | 38 | 39 | 40 | 41 | 42 | 43 | 44 | 45 | 46 | 47 | 48 |
| pStateIdx | 48 | 49 | 50 | 51 | 52 | 53 | 54 | 55 | 56 | 57 | 58 | 59 | 60 | 61 | 62 | 63 |
| transIdxLps | 33 | 33 | 34 | 34 | 35 | 35 | 35 | 36 | 36 | 36 | 37 | 37 | 37 | 38 | 38 | 63 |
| transIdxMps | 49 | 50 | 51 | 52 | 53 | 54 | 55 | 56 | 57 | 58 | 59 | 60 | 61 | 62 | 62 | 63 |

Thus, in ITU-T H.265, if the bin value is determined to be equal to the MPS, the LPS probability value is decreased. If the bin value is determined to be equal to the LPS, the LPS probability value is increased and further, if the current probability state pLPS is 0.5 (e.g., pStateIdx equals 0), a LPS inversion occurs (e.g., the previous LPS value becomes the MPS). It should be noted that, according to ITU-T H.265, some syntax elements are entropy coded using arithmetic coding according to equal probability states; such coding may be referred to as bypass coding. The probability estimation provided in ITU-T H.265 has a relatively low complexity. Improved probability estimations (e.g., more accurate estimations) with higher complexity have been proposed for use in binary arithmetic coding.

JEM modifies the CABAC process in ITU-T H.265 by applying a "multi-hypothesis" probability update model based on two probability estimates. In particular, in JEM, two probability estimates $_0P$ and $P1$ that are associated with each context model and are updated independently with different adaptation rates as follows:

$$P_0^{new} = P_0^{old} + ((2^{15} - P_0^{old}) >> M_i), \text{ if input is '1'},$$
$$P_0^{old} - (P_0^{old} >> M_i), \text{ if input is '0'},$$

$$P_1^{new} = P_1^{old} + ((2^{15} - P_1^{old}) >> 8), \text{ if input is '1'}, P_1^{old} - (P_1^{old} >> 8), \text{ if input is '0'},$$

Where,
$P_j^{old}$ and $P_j^{new}$ (j=0, 1) represent the probabilities before and after decoding a bin, respectively;
$M_i$ (being 4, 5, 6, 7) is a parameter which controls the probability updating speed for the context model with index equal to i; and
$2^{15}$ is the maximum probability (fixed-point representation of 1.0).

In JEM, the probability estimate P used for the interval subdivision is the average of $P_0^{new}$ and $P_1^{new}$, e.g., $P=(P_0^{new}+P_1^{new})/2$. In the JEM, the value of the parameter Mi used in the equation above, that controls the probability updating speed for each context model is assigned as follows: at the encoder side, the coded bins associated with each context model are recorded. After one slice is coded, for each context model with index equal to i, the rate costs of using different values of $M_i$ (being 4, 5, 6, 7) are calculated and the one that provides the minimum rate cost is selected. For simplicity, this selection process is performed only when a new combination of slice type and slice-level quantization parameter are encountered. A 1-bit flag is signaled for each context model i to indicate whether Mi is different from the default value of 4. When the value of the flag is 1, two bits are used to indicate whether Mi is equal to 5, 6, or 7.

In JEM, all possible values of $pLPS_i * R_{i-1}$ are pre-computed according to a 64-column*512-row lookup table providing 8-bit values for each $pLPS_i * R_{i-1}$. That is P is mapped to one of 512 probability states and for bit value 0 there are 64 columns with a corresponding 8-bit value for $R_{i-1}$. It should be noted that in JEM, the LPS is always considered to be 0.

It should be noted that the updating of a probability estimate as provided in JEM may be more generally described as follows:
if(binVal==0)
$P^{new} = P^{old} - (P^{old} >> d)$ else
$$P^{new}=P^{old} ((2N-P^{old})>>d)$$
Where,
$P^{old}$ represents the estimated probability before the update;
$P^{new}$ represents the estimated probability according to the update;
d is a parameter which controls the probability updating speed;
N represents the precision of probabilities (e.g., the bit-width); and
$2^N$ is the maximum probability (fixed-point representation of 1.0)

The probability estimate may be implemented according to the following operations:

$$P^{new}=P^{old}-((P^{old}-(\text{flag}_0\&(2^N+1-2^d)))>>d)$$

Where,
$\text{flag}_0$ is 0 if(binVal==0) is TRUE, otherwise $\text{flag}_0$ is 1.

It should be noted that at the video decoder, the determination of whether (binVal==0) (or whether (binVal==valMps)) for a particular bin may occur relatively late. In one example, in the case where the implementation of determining $P^{new}$ is conditioned on if(binVal==0), as provided above, in order to speed-up the determination of $P^{new}$, two values of $P^{new}$ may be calculated (e.g., one for the case where if(binVal==0) is TRUE and one for the case where if(binVal==0) is FALSE) and one of the values of $P^{new}$ may be selected once the determination of if(binVal==0) is made. However, it may be inefficient to calculate two values for $P^{new}$. It should be noted that in the implementation where $P^{new}$ is calculated using $\text{flag}_0$ in the equation above, fewer operations are used for determining $P^{new}$ than in the case where two values of $P^{new}$ are calculated. However, according to the equation above, operations may be delayed until (binVal==0) is known. Thus, current techniques for updating a probability estimate may be less than ideal.

Figure 3:
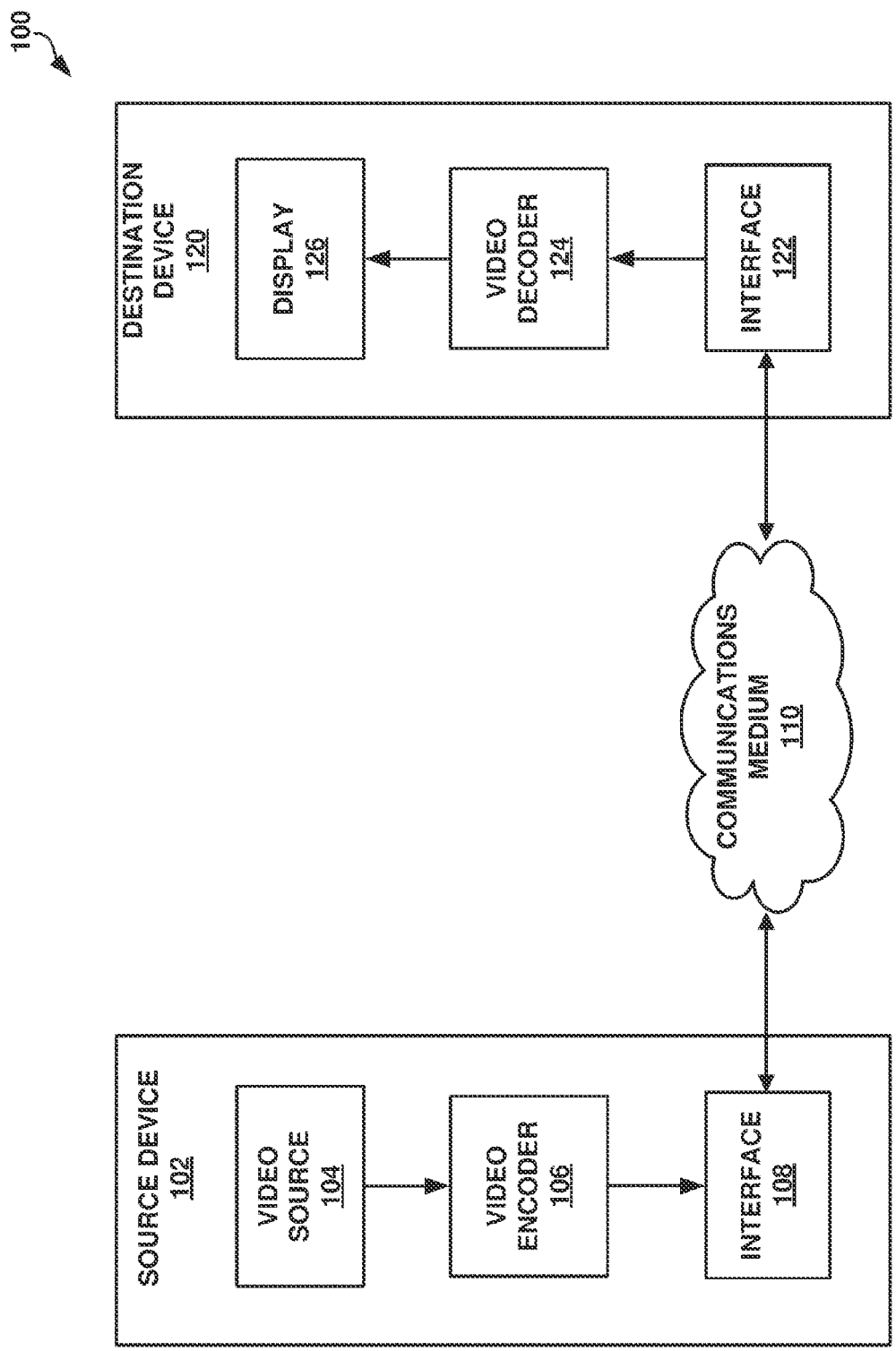
FIG. 3 is a block diagram illustrating an example of a system that may be configured to encode and decode video data according to one or more techniques of this disclosure in accordance with an example implementation of the present disclosure.

FIG. 3 is a block diagram illustrating an example of a system that may be configured to code (e.g., encode and/or decode) video data in accordance with an example implementation of the present disclosure. System 100 represents an example of a system that may perform video coding using partitioning techniques described in accordance with an example implementation of the present disclosure. As illustrated in FIG. 3, system 100 includes source device 102, communications medium 110, and destination device 120. In the example illustrated in FIG. 3, source device 102 may include any device configured to encode video data and transmit encoded video data to communications medium 110. Destination device 120 may include any device configured to receive encoded video data via communications medium 110 and to decode encoded video data. Source device 102 and/or destination device 120 may include computing devices equipped for wired and/or wireless communications and may include set top boxes, digital video recorders, televisions, desktop, laptop, or tablet computers, gaming consoles, mobile devices, including, for example, "smart" phones, cellular telephones, personal gaming devices, and medical imagining devices.

Communications medium 110 may include any combination of wireless and wired communication media, and/or storage devices. Communications medium 110 may include coaxial cables, fiber optic cables, twisted pair cables, wireless transmitters and receivers, routers, switches, repeaters, base stations, or any other equipment that may be useful to facilitate communications between various devices and sites. Communications medium 110 may include one or more networks. For example, communications medium 110 may include a network configured to enable access to the World Wide Web, for example, the Internet. A network may operate according to a combination of one or more telecommunication protocols. Telecommunications protocols may include proprietary aspects and/or may include standardized telecommunication protocols. Examples of standardized telecommunications protocols include Digital Video Broadcasting (DVB) standards, Advanced Television Systems Committee (ATSC) standards, Integrated Services Digital Broadcasting (ISDB) standards, Data Over Cable Service Interface Specification (DOCSIS) standards, Global System Mobile Communications (GSM) standards, code division multiple access (CDMA) standards, 3rd Generation Partnership Project (3GPP) standards, European Telecommunications Standards Institute (ETSI) standards, Internet Protocol (IP) standards, Wireless Application Protocol (WAP) standards, and Institute of Electrical and Electronics Engineers (IEEE) standards.

Storage devices may include any type of device or storage medium capable of storing data. A storage medium may include a tangible or non-transitory computer-readable media. A computer readable medium may include optical discs, flash memory, magnetic memory, or any other suitable digital storage media. In some examples, a memory device or portions thereof may be described as non-volatile memory, and in other examples, portions of memory devices may be described as volatile memory. Examples of volatile memories may include random access memories (RAM), dynamic random access memories (DRAM), and static random access memories (SRAM). Examples of non-volatile memories may include magnetic hard discs, optical discs, floppy discs, flash memories, or forms of electrically programmable memories (EPROM) or electrically erasable and programmable (EEPROM) memories. Storage device(s) may include memory cards (e.g., a Secure Digital (SD) memory card), internal/external hard disk drives, and/or internal/external solid-state drives. Data may be stored on a storage device according to a defined file format.

Referring again to FIG. 3, source device 102 includes video source 104, video encoder 106, and interface 108. Video source 104 may include any device configured to capture and/or store video data. For example, video source 104 may include a video camera and a storage device operably coupled thereto. Video encoder 106 may include any device configured to receive video data and generate a compliant bitstream representing the video data. A compliant bitstream may refer to a bitstream that a video decoder can receive and reproduce video data therefrom. Aspects of a compliant bitstream may be defined according to a video coding standard. When generating a compliant bitstream video encoder 106 may compress video data. Compression may be lossy (discernible or indiscernible) or lossless. Interface 108 may include any device configured to receive a compliant video bitstream and transmit and/or store the compliant video bitstream to a communications medium. Interface 108 may include a network interface card, such as an Ethernet card, and may include an optical transceiver, a radio frequency transceiver, or any other type of device that can send and/or receive information. Further, interface 108 may include a computer system interface that may enable a compliant video bitstream to be stored on a storage device. For example, interface 108 may include a chipset supporting Peripheral Component Interconnect (PCI) and Peripheral Component Interconnect Express (PCIe) bus protocols, proprietary bus protocols, Universal Serial Bus (USB) protocols, I²C, or any other logical and physical structure that may be used to interconnect peer devices.

Referring again to FIG. 3, destination device 120 includes interface 122, video decoder 124, and display 126. Interface 122 may include any device configured to receive a compliant video bitstream from a communications medium. Interface 108 may include a network interface card, such as an Ethernet card, and may include an optical transceiver, a radio frequency transceiver, or any other type of device that can receive and/or send information. Further, interface 122 may include a computer system interface enabling a compliant video bitstream to be retrieved from a storage device. For example, interface 122 may include a chipset supporting PCI and PCIe bus protocols, proprietary bus protocols, USB protocols, I²C, or any other logical and physical structure that may be used to interconnect peer devices. Video decoder 124 may include any device configured to receive a compliant bitstream and/or acceptable variations thereof and reproduce video data therefrom. Display 126 may include any device configured to display video data. Display 126 may include one of a variety of display devices such as a liquid crystal display (LCD), a plasma display, an organic light-emitting diode (OLED) display, or another type of display. Display 126 may include a High Definition display or an Ultra High Definition display. It should be noted that although in the example illustrated in FIG. 3, video decoder 124 is described as outputting data to display 126, video decoder 124 may be configured to output video data to various types of devices and/or sub-components thereof. For example, video decoder 124 may be configured to output video data to any communication medium, as described herein.

Figure 4:
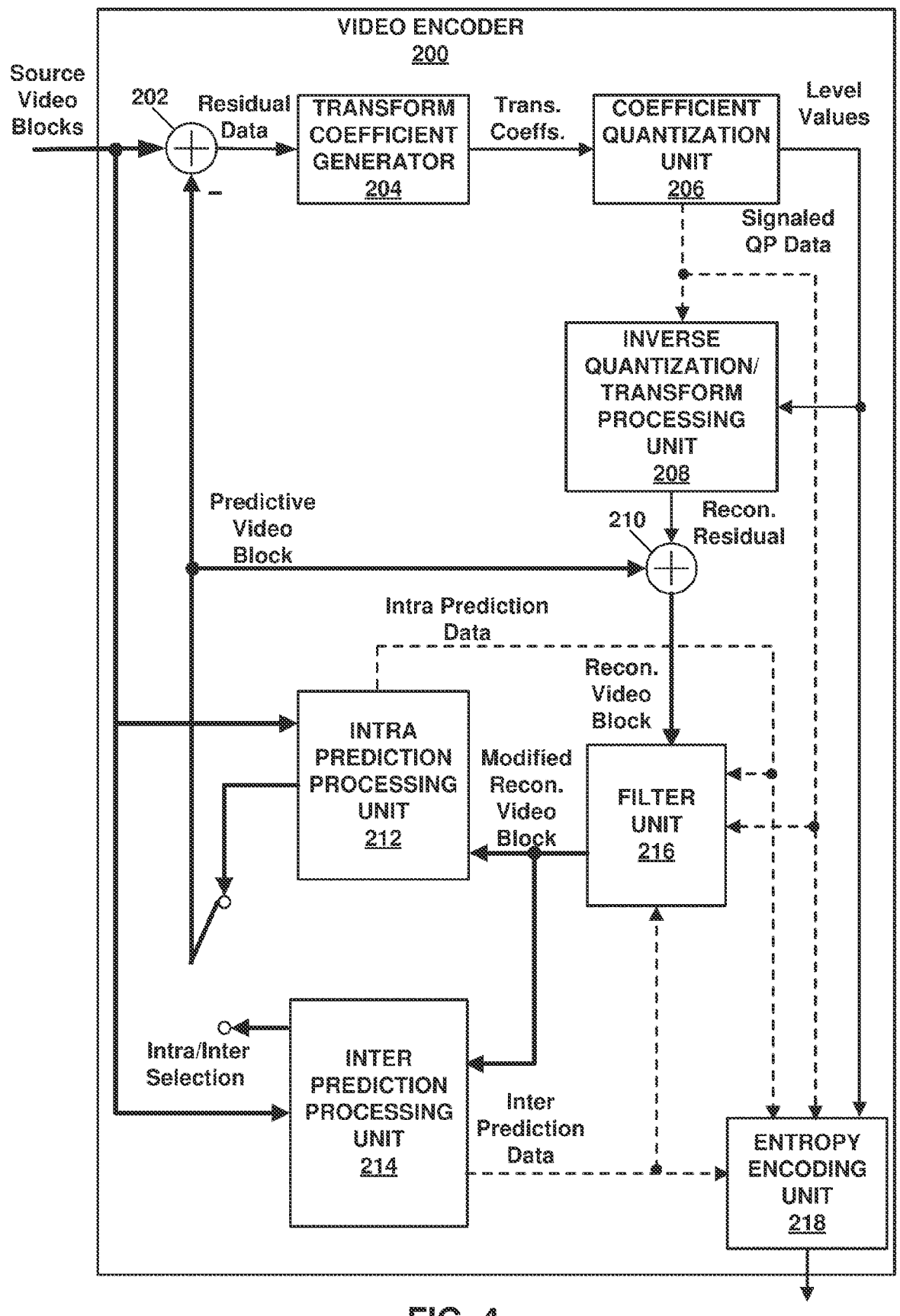
FIG. 4 is a block diagram illustrating an example of a video encoder that may be configured to encode video data in accordance with an example implementation of the present disclosure.

FIG. 4 is a block diagram illustrating an example of video encoder 200 that may be configured to encode video data in accordance with an example implementation of the present disclosure. It should be noted that although example video encoder 200 is illustrated as having distinct functional blocks, such an illustration is for descriptive purposes and does not limit video encoder 200 and/or sub-components thereof to a particular hardware or software architecture. Functions of video encoder 200 may be realized using any combination of hardware, firmware, and/or software implementations. In one example, video encoder 200 may be configured to encode video data according to the techniques described herein. Video encoder 200 may perform intra prediction coding and inter prediction coding of picture areas, and, as such, may be referred to as a hybrid video encoder. In the example illustrated in FIG. 4, video encoder 200 receives source video blocks. In some examples, source video blocks may include areas of a picture that has been divided according to a coding structure. For example, source video data may include macroblocks, CTUs, CBs, sub-divisions thereof, and/or another equivalent coding unit. In some examples, video encoder 200 may be configured to perform additional sub-divisions of source video blocks. It should be noted that some techniques described herein may be generally applicable to video coding, regardless of how source video data is partitioned prior to and/or during encoding. In the example illustrated in FIG. 4, video encoder 200 includes summer 202, transform coefficient generator 204, coefficient quantization unit 206, inverse quantization/transform processing unit 208, summer 210, intra prediction processing unit 212, inter prediction processing unit 214, filter unit 216, and entropy encoding unit 218.

As illustrated in FIG. 4, video encoder 200 receives source video blocks and outputs a bitstream. Video encoder 200 may generate residual data by subtracting a predictive video block from a source video block. Summer 202 represents a component configured to perform this subtraction operation. In one example, the subtraction of video blocks occurs in the pixel domain. Transform coefficient generator 204 applies a transform, such as a discrete cosine transform (DCT), a discrete sine transform (DST), or a conceptually similar transform, to the residual block or sub-divisions thereof (e.g., four 8×8 transforms may be applied to a 16×16 array of residual values) to produce a set of residual transform coefficients. Transform coefficient generator 204 may be configured to perform any and all combinations of the transforms included in the family of discrete trigonometric transforms. As described above, in ITU-T H.265, TBs are restricted to the following sizes: 4×4, 8×8, 16×16, and 32×32. In one example, transform coefficient generator 204 may be configured to perform transformations according to arrays having sizes of 4×4, 8×8, 16×16, and 32×32. In one example, transform coefficient generator 204 may be further configured to perform transformations according to arrays having other dimensions. In particular, in some cases, it may be useful to perform transformations on rectangular arrays of difference values. In one example, transform coefficient generator 204 may be configured to perform transformations according to the following sizes of arrays: 2×2, 2×4N, 4M×2, and/or 4M×4N. In one example, a 2-dimensional (2D) M×N inverse transform may be implemented as a 1-dimensional (1D) M-point inverse transform followed by a 1D N-point inverse transform. In one example, a 2D inverse transform may be implemented as a 1D N-point vertical transform followed by a 1D N-point horizontal transform. In one example, a 2D inverse transform may be implemented as a 1D N-point horizontal transform followed by a 1D N-point vertical transform. Transform coefficient generator 204 may output transform coefficients to coefficient quantization unit 206.

Coefficient quantization unit 206 may be configured to perform quantization of the transform coefficients. As described above, the degree of quantization may be modified by adjusting a quantization parameter. Coefficient quantization unit 206 may be further configured to determine quantization parameters and output QP data (e.g., data used to determine a quantization group size and/or delta QP values) that may be used by a video decoder to reconstruct a quantization parameter to perform inverse quantization during video decoding. It should be noted that in other examples, one or more additional or alternative parameters may be used to determine a level of quantization (e.g., scaling factors). The techniques described herein may be generally applicable to determining a level of quantization for transform coefficients corresponding to a component of video data based on a level of quantization for transform coefficients corresponding another component of video data.

Referring again to FIG. 4, quantized transform coefficients are output to inverse quantization/transform processing unit 208. Inverse quantization/transform processing unit 208 may be configured to apply an inverse quantization and an inverse transformation to generate reconstructed residual data. As illustrated in FIG. 4, at summer 210, reconstructed residual data may be added to a predictive video block. In this manner, an encoded video block may be reconstructed, and the resulting reconstructed video block may be used to evaluate the encoding quality for a given prediction, transformation, and/or quantization. Video encoder 200 may be configured to perform multiple coding passes (e.g., perform encoding while varying one or more of a prediction, transformation parameters, and quantization parameters). The rate-distortion of a bitstream or other system parameters may be optimized based on evaluation of reconstructed video blocks. Further, reconstructed video blocks may be stored and used as references for predicting subsequent blocks.

As described above, a video block may be coded using an intra prediction. Intra prediction processing unit 212 may be configured to select an intra prediction mode for a video block to be coded. Intra prediction processing unit 212 may be configured to evaluate a frame and/or an area thereof and determine an intra prediction mode to use to encode a current block. As illustrated in FIG. 4, intra prediction processing unit 212 outputs intra prediction data (e.g., syntax elements) to entropy encoding unit 218 and transform coefficient generator 204. As described above, a transform performed on residual data may be mode dependent. As described above, possible intra prediction modes may include planar prediction modes, DC prediction modes, and angular prediction modes. Further, in some examples, a prediction for a chroma component may be inferred from an intra prediction for a luma prediction mode. Inter prediction processing unit 214 may be configured to perform inter prediction coding for a current video block. Inter prediction processing unit 214 may be configured to receive source video blocks and calculate a motion vector for PUs of a video block. A motion vector may indicate the displacement of a PU (or similar coding structure) of a video block within a current video frame relative to a predictive block within a reference frame. Inter prediction coding may use one or more reference pictures. Further, motion prediction may be uni-predictive (e.g., use one motion vector) or bi-predictive (e.g., use two motion vectors). Inter prediction processing unit 214 may be configured to select a predictive block by calculating a pixel difference determined by, for example, sum of absolute difference (SAD), sum of square difference (SSD), or other difference metrics. As described above, a motion vector may be determined and specified according to motion vector prediction. Inter prediction processing unit 214 may be configured to perform motion vector prediction, as described above. Inter prediction processing unit 214 may be configured to generate a predictive block using the motion prediction data. For example, inter prediction processing unit 214 may locate a predictive video block within a frame buffer (not shown in FIG. 4). It should be noted that inter prediction processing unit 214 may further be configured to apply one or more interpolation filters to a reconstructed residual block to calculate sub-integer pixel values for use in motion estimation. Inter prediction processing unit 214 may output motion prediction data for a calculated motion vector to entropy encoding unit 218. As illustrated in FIG. 4, inter prediction processing unit 214 may receive a reconstructed video block via filter unit 216. Filter unit 216 may be configured to perform deblocking and/or Sample Adaptive Offset (SAO) filtering. Deblocking refers to the process of smoothing the boundaries of reconstructed video blocks (e.g., make boundaries less perceptible to a viewer). SAO filtering is a non-linear amplitude mapping that may be used to improve reconstruction by adding an offset to reconstructed video data.

Referring again to FIG. 4, entropy encoding unit 218 receives quantized transform coefficients and predictive syntax data (e.g., intra prediction data, motion prediction data, QP data, etc.). It should be noted that in some examples, coefficient quantization unit 206 may perform a scan of a matrix including quantized transform coefficients before the coefficients are output to entropy encoding unit 218. In other examples, entropy encoding unit 218 may perform a scan. Entropy encoding unit 218 may be configured to perform entropy encoding according to one or more of the techniques described herein. Entropy encoding unit 218 may be configured to output a compliant bitstream, e.g., a bitstream that a video decoder can receive and reproduce video data therefrom.

Figure 5:
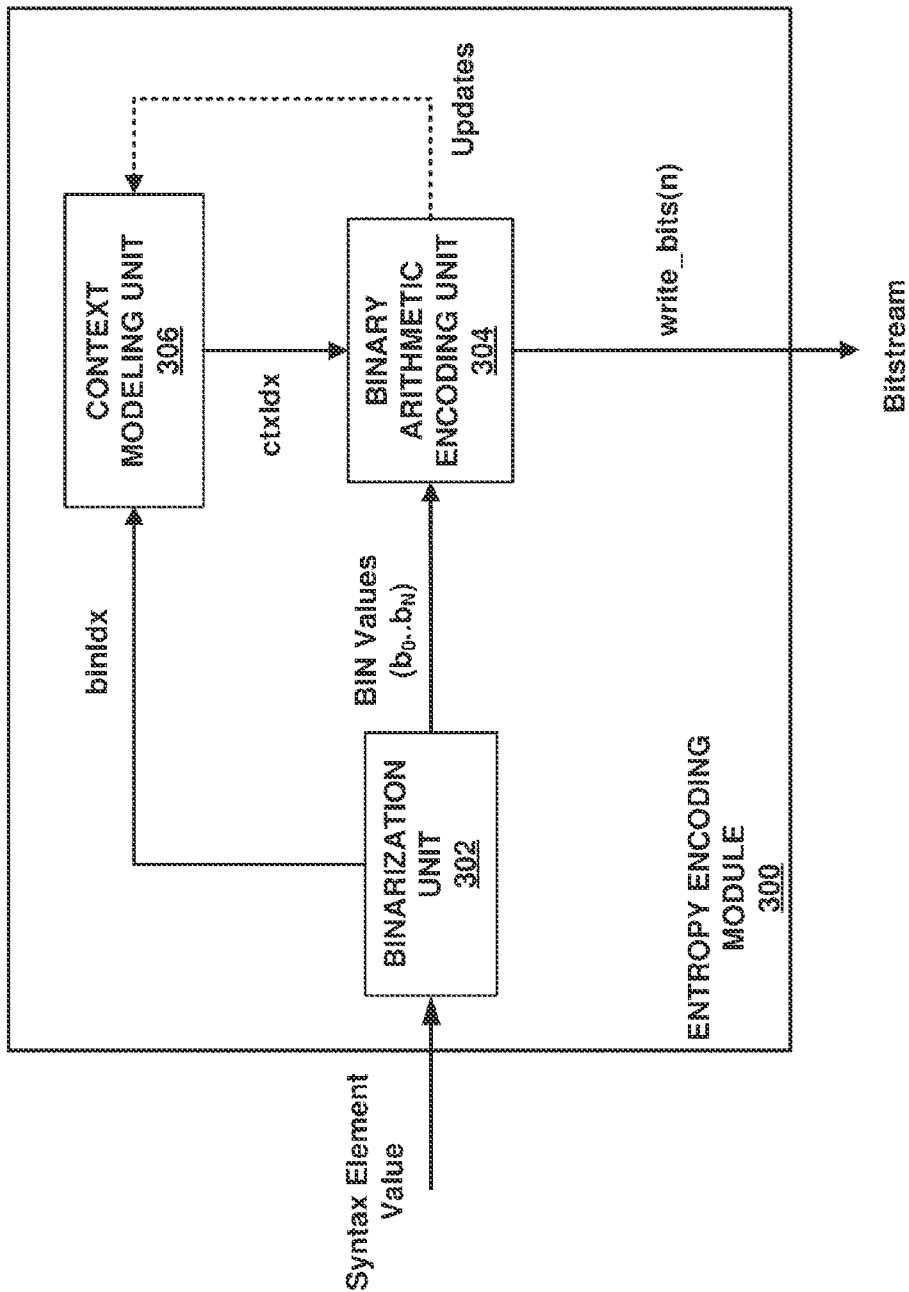
FIG. 5 is a block diagram illustrating an example of an entropy encoder that may be configured to encode video data in accordance with an example implementation of the present disclosure.

FIG. 5 is a block diagram illustrating an example of an entropy encoder that may be configured to encode values video data in accordance with an example implementation of the present disclosure. Entropy encoding unit 300 may include a context adaptive entropy encoding unit, e.g., a CABAC encoder. As illustrated in FIG. 5, entropy encoder 300 includes binarization unit 302, binary arithmetic encoding unit 304, and context modeling unit 306. Entropy encoding unit 300 may receive one or more syntax elements values and output a compliant bitstream. As described above, binarization includes representing a value of a syntax element into a bin string. Binarization unit 302 may be configured to receive a value for a syntax element and produce a bin string according to one or more binarization techniques. Binarization unit 302 may use, for example, any one or combination of the following techniques to produce a bin string: fixed length coding, unary coding, truncated unary coding, truncated Rice coding, Golomb coding, exponential Golomb Coding, and Golomb-Rice Coding.

As described above, binary arithmetic encoding codes a series of 0's and 1's based on the principle of recursive interval subdivision, where for a received binary string $(b_1, \ldots, b_N)$, an interval $R_0$ is recursively divided based on the estimated probability of $b_1$ being the LPS, and bits are written to a bitstream according to a renormalization process. As further described above, the estimated probability of bi being the LPS is based on a context index. Binary arithmetic encoding unit 304 is configured to receive a bin string from binarization unit 302 and a context index corresponding to a bin from context modeling unit 306, and perform binary arithmetic encoding on the bin string. That is, binary arithmetic encoding unit 304 is configured to write bits to a bitstream according to a renormalization process and further indicate an observed value of a bin such that a context model may be updated. The context models may be defined according to a video coding standard, such as, for example, ITU-T H.265. The context models may be stored in a memory. For example, context modeling unit 306 may store a series of indexed tables and/or utilize mapping functions to determine a context model for a particular bin. It should be noted that the functions of binary coding are not limited to particular function blocks, and the example of binary arithmetic encoding unit 304 and context modeling unit 306 in the example of FIG. 5 should not be construed as limiting.

As described above, current techniques for updating a probability estimate may be less than ideal. According to the techniques herein, in one example, context modeling unit 306 may update a probability estimate, $P^{new}$, according to the following:

if(binVal==valMps)
 $P^{new}=P^{old}-(P^{old}>>d)$
else
 $P^{new}=P^{old}((2^N-1-P^{old})>>d)$
Where,
$P^{new}$ represent the estimated probability of occurrence of the LPS before the update;
$P^{new}$ represent the probabilities estimated probability of occurrence of the LPS according to the update;
d is a parameter which controls the probability updating speed;

N represents the precision of probabilities (e.g., bit-width); and $2^N-1$ is the maximum probability (fixed-point representation of 1.0)

Further, updating the probability estimate may be implemented as follows:

$$P^{new} = P^{old} - ((P^{old} - (\text{flag}_{LPS} \& (2^N - 2_d))) >> d)$$

Where, $\text{flag}_{LPS}$ is 0 if(binVal==valMps) is TRUE, otherwise $\text{flag}_{LPS}$ is 1.

The implementation above may be simplified to the following:

$$P^{new} = P^{old} - (P^{old} >> d) + (\text{flag}_{LPS} \& (2^{N-d} - 1)))$$

It should be noted that the simplified implementation includes a relatively low operation count and the value of $\text{flag}_{LPS}$ is only needed towards the end of computation. It should be noted that in some cases, instead of setting $\text{flag}_{LPS}$ equal to 1, when (binVal==valMps) is FALSE, $\text{flag}_{LPS}$ may be set to satisfy a condition where all bits of the binary representation are set to '1' such that x & $\text{flag}_{LPS}$=x for any value of x. For example, $\text{flag}_{LPS}$ may be set to −1 instead of 1, as −1 achieves this property when using the typical 2's complement representation.

Further, in one example, a rounding may be used such that $2^{N-d}-1$ becomes $2^{N-d}$ as follows:

$$P^{new} = P^{old} - ((P^{old} + 2^{d-1}) >> d) + (\text{flag}_{LPS} \& 2^{N-d})$$

Further, in one example, the computation of $P^{new}$ may be as follows:

$$P^{new} = P^{old} - (P^{old} >> d) + (\text{flag}_{LPS} \& 2^{N-d})$$

In such a case, $P^{old}$ may not be allowed to get as large as $2^N-1$, as $P^{new}$ would take value $2^N$ and overflow the N-bit unsigned range. It should be noted that in some cases the $\text{flag}_{LPS}$ may be replaced with $\text{flag}_0$ described above, if the LPS/MPS convention is not used. Further, in the case where the LPS/MPS convention is used, an LPS/MPS switch can be implemented using bit inversion.

As described above, in some examples, a probability update model may be based on two probability estimates. According to the techniques herein, in one example, context modeling unit 306 may determine a probability estimate, P, based on probability estimates $P_0$ and $P_1$ as follows:

$$P = P_0 + P_1$$

Where,

A flag, MPS, is used to indicate the value of the MPS;

P and $P_0$ both use an N-bit unsigned representation;

P is known to represent a number <0.5, but $P_0$ is not; and

P is always larger than $P_0$.

In this case, in one example, an updated value of P, $P^{new}$, may computed as follows:

$$P_0^{new} = P_0^{old} - (P_0^{old} >> d_0) + (\text{flag}_{LPS} \& (2^{N-d0} - 1)));$$

$$P^{new} = (P^{old} - P_0^{old}) - ((P^{old} - P_0^{old}) >> d_1) + P_0^{new} + (\text{flag}_{LPS} \& 2^{N-d1});$$

$$MPS_{new} = MPS^{old}$$

Where, $P^{old}$ represents the estimated probability of occurrence of the LPS before the update;

$P^{new}$ represents the estimated probability of occurrence of the LPS according to the update;

$MPS_{old}$ represents the MPS before the update;

$MPS_{new}$ represents the MPS according to the update;

$d_0$ and $d_1$ are parameters which control the probability updating speed;

N represents the precision of probabilities (e.g., the bit-width);

$2^N-1$ is the maximum probability of $P_0^{new}$ (fixed-point representation of 1.0); and $2^{N+1}-1$ is the maximum probability of $P^{new}$ (fixed-point representation of 1.0).

It should be noted that if $P_0^{new}$ is 15-bits and $P^{new}$ is 16-bits, $P_0^{new}$, $P^{new}$, and $MPS_{new}$ may be packed into a single 32-bit word. If $P_0^{new}$, $P^{new}$, and $MPS_{new}$ are packed into a single 32-bit word, the terms using $\text{flag}_{LPS}$ can be computed and added jointly. For example, if $d_0=4$ and $d_1=8$, $(2^{N-d0}-1)=(2^{15-4}-1)$ and $2N-d1=2^{15-8}$ and a joint computation becomes $2^{16}(2^{15-8}+2^{15-4}-1)+2^1(2^{15-4}-1)$, $P_0^{new}$ is at bits 1-15 and $P^{new}$ is at bits 16-31.

It should be noted that when $P^{new}$ becomes equal to or larger than $2^N$, the MPS value is changed and the probabilities are inverted as follows:

$$P_0^{new} = P_0^{new} \char`\^ (2^N-1);$$

$$P^{new} = P^{new} \char`\^ (2^{N+1}-1);$$

$$MPS_{new} = MPS_{new} \char`\^ 1$$

It should be noted that when $P_0^{new}$, $P^{new}$, and $MPS_{new}$ are packed into a single 32-bit word, these operations can be performed with a shift arithmetic right operation and an exclusive or operation. That is, if $P_0$ is at bits 1-15, P is at bits 16-31, and MPS is at bit 0, a shift arithmetic right operation would yield 0 if P is smaller than $2^N$, and −1 otherwise. Alternatively, this operation can be described as copying the value of bit 31 into all bits of a 32-bit word. The result of the shift arithmetic right operation is then used as input to the exclusive or operation with the packed 32-bit word containing the values of $P_0$, P, and MPS.

As described above, for a probability estimate $pLPS_i$, a sub-interval is calculated as follows: $pLPS_i * R_{i-1}$. According to the techniques herein, if $pLPS_i$ is a 15-bit P value, and R is 9-bits, in one example, $pLPS_i * R_{i-1}$ may be calculated by retrieving the ((P>>10)+R & 224)-th entry of a lookup table, such that the lookup table is a one-dimensional array having 256 entries, where each entry includes an 8-bit value. The n-th entry in the lookup table approximates the value (2* ((n&224)+256)+1)*(2*(n&31)+1)/128.

In one example, $pLPS_i * R_{i-1}$ may be calculated by the following multiplication implementation, ((P>>8)*R>>8)+1, which is a 7-bit by 9-bit multiplication. Here, the bit width of P is reduced from 15-bits to 7-bits such as to reduce the implementation cost in hardware. It should be noted that the +1 operation is added to compensate for rounding toward 0 in >> operations. More generally the multiplication can be expressed as ((P>>S)*R>>(16−S))+1, where S is a constant between 0 and 15 that controls a tradeoff between implementation cost and accuracy. Implementation cost rises and accuracy increases as S decreases. Reduced accuracy leads of a loss of compression efficiency.

In this manner, video encoder 200 represents an example of a device configured to determine whether a bin value is equal to a least probable state; and update a probability estimate by conditionally adding $2^{N-d}$ to the probability estimate in the case where the bin value is equal to the least probable state, wherein N is the width in bits of the probability estimate and d is a parameter which controls the probability updating speed.

It should be noted that in response to a "Joint Call for Proposals on Video Compression with Capabilities beyond HEVC," jointly issued by VCEG and MPEG, multiple proposals of video coding and responses thereto were submitted by various groups at the 10$^{th}$ Meeting of ISO/IEC JTC1/SC29/WG11 16-20 Apr. 2018, San Diego, CA As a result of these submissions, "Core Experiment 5: Arithmetic Coding Engine," ISO/IEC JTC1/SC29/WG11 Document: JVET-J1025, 10th Meeting 16-20 Apr. 2018, San Diego, CA (hereinafter "J1025"), which is incorporated by reference herein, describes experiments including methods for deriving a subinterval range using either a table lookup or an actual multiplication. Some methods support both implementations, as such a feature is indeed desirable. However, it is further desirable that table lookup and actual multiplication implementations should be as simple as possible.

Experiments in J1025 typically define a state update rule for probability estimation as:

if (symbol)

$$q=q+((32768-q)>>n)$$

else $$q=q-(q>>n)$$

where q is a count or probability estimate and n is an adaptation rate.

Such an expression of an update is undesirable in a software implementation, as having two distinct paths may lead to branch misprediction. Further, branch misprediction may be compounded by the fact that the value of a symbol is needed early in the computation (e.g., as described above), increasing the chances that a branch is executed speculatively. It should be noted that using a multiplexer in a hardware implementation to select one of two outcomes is also less than ideal.

In a manner similar to the techniques described above, an alternative branchless implementation can be achieved for computing q as follows:

$$t=q-((32768-(1<<n)+1)\&\ symbol)$$

$$q=q-(t>>n)$$

where the value of "symbol" is assumed to be either 0 or −1.

It should be noted that while such an implementation avoids issues associated with branching, it requires the value of "symbol" to be known early in the computation. Indeed, four operations need to be executed in sequence once "symbol" is available: &, −, >>, and −. This is disadvantageous in a decoder in cases where latency matters.

In one example, the update rule may be modified by replacing the constant 32768 by 32767 as follows:

if (symbol)

$$q=q+((32767-q)>>n)$$

else $$q=q-(q>>n)$$

It should be noted that when replacing the constant 32768 by 32767, all the implementations described above can still be realized, and additional implementations, such as those described below, become realizable. For example, one could still use conditional execution while delaying the use of the "symbol" variable as follows:

$$q=q-(q>>n)$$

if (symbol)

$$q=q+(32767>>n)$$

The use of the "symbol" value can similarly be delayed in the branchless form as follows:

$$q=q-(q>>n)$$

$$q=q+((32767>>n)\&\ symbol)$$

It should be noted that in this case only two operations (instead of four) are dependent on the value of "symbol": & and +. Also, it should be noted that 32767−x may be slightly easier to compute in a hardware implementation than 32768−x, as each bit of the result can be computed independently (no carry propagation).

In one example, experiment CE5.B2 of JVET-J1025 may be generally summarized as follows: probability estimates $q_a$ and $q_b$ resulting from two different estimators, each estimate being 15-bits wide, and a range value r, which is 9-bits wide, are defined. Further, q is defined as $q_a+q_b$, and $q_{LPS}$ is defined as q^((q & 32768)? 65535:0). It should be noted that q can be implemented in the C programming language relatively easily if the data type of q is defined as int16_t:$q_{LPS}$=q^(q>>15). Additionally, $r_3$ may be defined as $r_3$=r>>5 and $q_5$ may be defined as $q_5$=$q_{LPS}$>>10. The subinterval range $r_{LPS}$ is then computed as:

$$r_{LPS}=((2*r_3+1)*(2*q_5+1)+4)>>3$$

It should be noted that with additional clipping of $r_{LPS}$ to the range of 4 to 32×($r_3$−4), the table used in experiment CE5.B2 of JVET-J1025 is obtained.

According to the techniques herein, it is proposed to modify the computation of the subinterval range $r_{LPS}$ and use the following expression, which is simpler and does not require any clipping, and further enables a wider range of implementations without having a noticeable impact on compression efficiency:

$$r_{LPS}=(r_3*q_5>>1)+k$$

where k is a constant that may have the following two properties:

The first property being:

k is larger than 0 such that $r_{LPS}$ cannot take value 0; and k is selected such that r−$r_{LPS}$ cannot be less than 128. This property guarantees that during renormalization after processing an MPS, the range register is shifted left by at most one bit position. The worst case happens for r=256 and $q_{LPS}$=32767.

The second property being:

The value of k is selected such that: 256−124+k>=128. Thus, k must be =<4.

Further, it should be noted that considering the equation for $r_{LPS}$ from CE5.B2 mentioned above, k should ideally be equal to 0.5×(0.5×$r_3$+0.5×$q_5$+0.25+1), or about 0.5×(0.5× 11.5+0.5×15.5+0.25+1), which is 7.375. However, this value exceeds the previously established bound of 4; thus, k may be set equal to 4.

It should be noted that when k is equal to 4, the computation of the subinterval range $r_{LPS}$ is implemented as follows:

$$r_{LPS}=((r>>5)*(q_{LPS}>>(b-5))>>1)+4,$$

where b is a bit-width.

It should be noted that this equation can be implemented using a 32×8×8=2048-bit lookup table.

Figure 6:
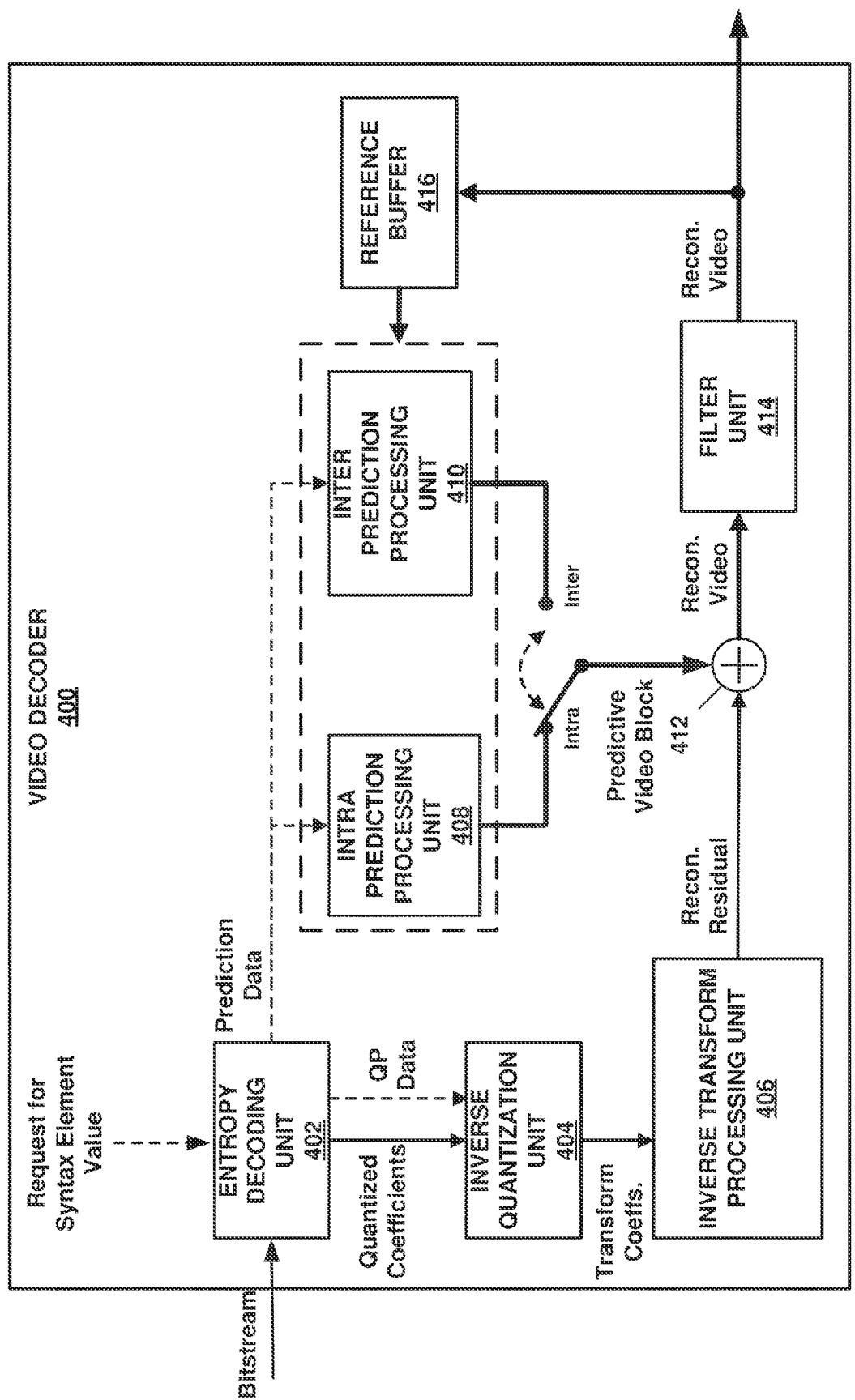
FIG. 6 is a block diagram illustrating an example of a video decoder that may be configured to decode video data in accordance with an example implementation of the present disclosure.

FIG. 6 is a block diagram illustrating an example of a video decoder that may be configured to decode video data in accordance with an example implementation of the present disclosure. In one example, video decoder 400 may be configured to reconstruct video data based on one or more of the techniques described above. That is, video decoder 400 may operate in a reciprocal manner to video encoder 200 described above. Video decoder 400 may be configured to perform intra prediction decoding and inter prediction decoding and, as such, may be referred to as a hybrid decoder. In the example illustrated in FIG. 6, video decoder 400 includes an entropy decoding unit 402, inverse quantization unit 404, inverse transformation processing unit 406, intra prediction processing unit 408, inter prediction processing unit 410, summer 412, filter unit 414, and reference buffer 416. Video decoder 400 may be configured to decode video data in a manner consistent with a video encoding system, which may implement one or more aspects of a video coding standard. It should be noted that although example video decoder 400 is illustrated as having distinct functional blocks, such an illustration is for descriptive purposes and does not limit video decoder 400 and/or sub-components thereof to a particular hardware or software architecture. Functions of video decoder 400 may be realized using any combination of hardware, firmware, and/or software implementations.

As illustrated in FIG. 6, entropy decoding unit 402 receives an entropy encoded bitstream. Entropy decoding unit 402 may be configured to decode quantized syntax elements and quantized coefficients from the bitstream according to a process reciprocal to an entropy encoding process. Entropy decoding unit 402 may be configured to perform entropy decoding according to any of the entropy coding techniques described above. Entropy decoding unit 402 may parse an encoded bitstream in a manner consistent with a video coding standard. Video decoder 400 may be configured to parse an encoded bitstream where the encoded bitstream is generated based on the techniques described above.

Figure 7:
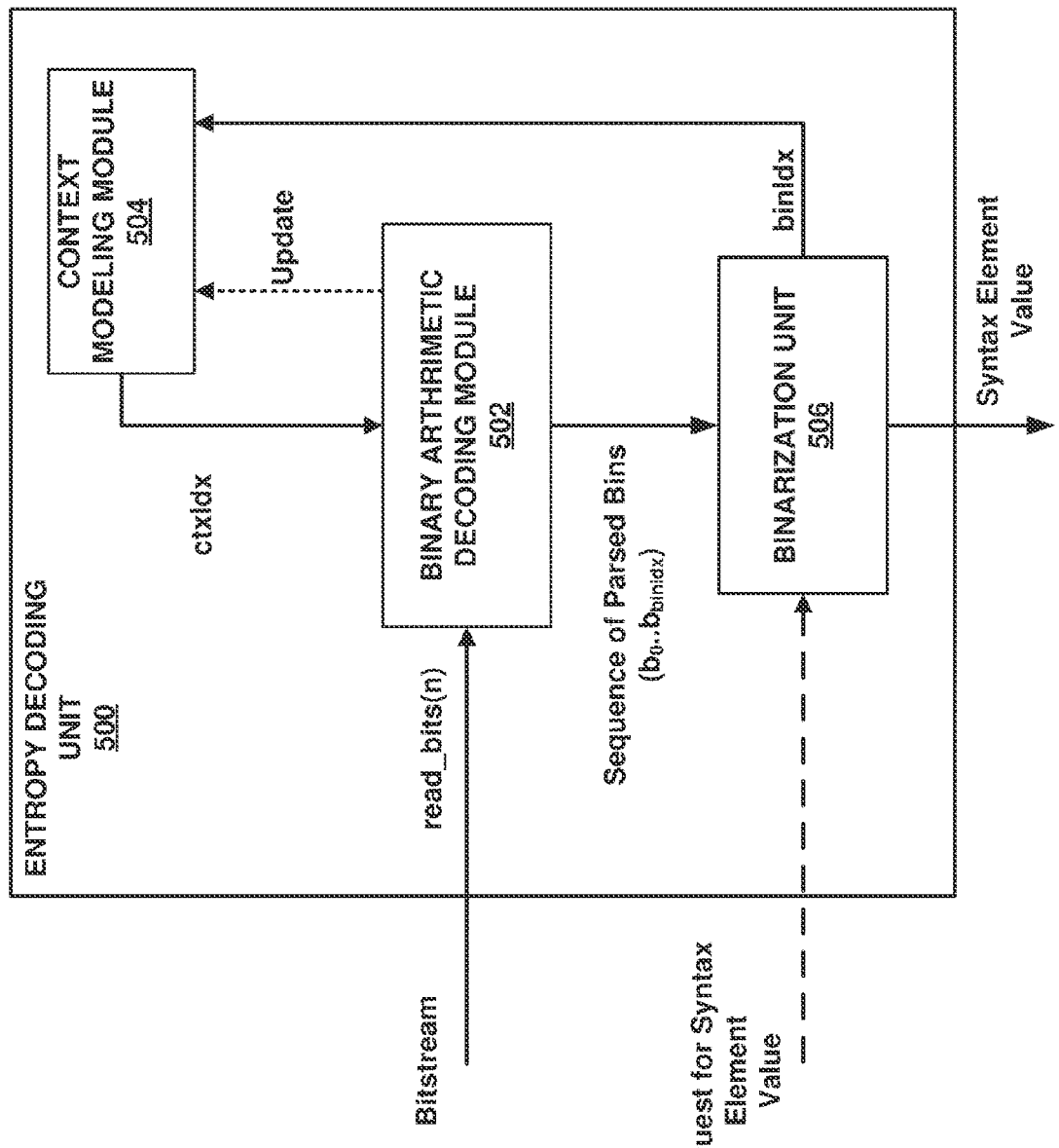
FIG. 7 is a block diagram illustrating an example of an entropy decoder that may be configured to decode video data in accordance with an example implementation of the present disclosure.

FIG. 7 is a block diagram illustrating an example of an entropy decoder that may be configured to decode video data in accordance with an example implementation of the present disclosure. Entropy decoding unit 500 receives an entropy encoded bitstream and decodes syntax elements from the bitstream. As illustrated in FIG. 7, entropy decoding unit 500 includes a binary arithmetic decoding module 502, a context modeling unit 504, and a binarization unit 506. Entropy decoding unit 500 may perform reciprocal functions to entropy encoding unit 300 described above with respect to FIG. 5.

As shown in FIG. 7, context modeling unit 508 and a binarization unit 506 receive a request for a syntax element value. Context modeling unit 504 determines a context index for the syntax element. Further, context modeling unit 504 updates a context index based on the determination made by binary arithmetic decoding module 502, for example, according to the probability estimate techniques described above. Binary arithmetic decoding module 502 receives n bits from the bitstream, e.g., the arithmetic code, and outputs a sequence of parsed bins based on the arithmetic code and the calculated sub-intervals. Binarization unit 506 determines possible valid binarization values for a syntax element and uses a bin matching function to determine if a series of parsed bin values corresponds to a valid value for the syntax element. When a series of bin values corresponds to a valid value for the syntax element, the value of the syntax element is output. That is, entropy decoding unit 500 is configured to determine the value of a bin based on the current sub-interval and bits from the bitstream, where the current sub-interval is determined based on techniques described herein, such as, for example, probability estimation techniques described herein. In this manner, video decoder 400 represents an example of a device configured to determine whether a bin value is equal to a least probable state; and update a probability estimate by conditionally adding $2^{N-d}$ to the probability estimate in the case where the bin value is equal to the least probable state, wherein N is the width in bits of the probability estimate and d is a parameter which controls the probability updating speed.

Referring again to FIG. 6, inverse quantization unit 404 receives quantized transform coefficients (e.g., level values) and quantization parameter data from entropy decoding unit 402. Quantization parameter data may include any and all combinations of delta QP values and/or quantization group size values and the like described above. Video decoder 400 and/or inverse quantization unit 404 may be configured to determine QP values used for inverse quantization based on values signaled by a video encoder and/or through video properties and/or coding parameters. That is, inverse quantization unit 404 may operate in a reciprocal manner to coefficient quantization unit 206 described above. For example, inverse quantization unit 404 may be configured to infer predetermined values), allowed quantization group sizes, and the like, according to the techniques described above. Inverse quantization unit 404 may be configured to apply an inverse quantization. Inverse transform processing unit 406 may be configured to perform an inverse transformation to generate reconstructed residual data. The techniques respectively performed by inverse quantization unit 404 and inverse transform processing unit 406 may be similar to techniques performed by inverse quantization/transform processing unit 208 described above. Inverse transform processing unit 406 may be configured to apply an inverse DCT, an inverse DST, an inverse integer transform, Non-Separable Secondary Transform (NSST), or a conceptually similar inverse transform processes to the transform coefficients in order to produce residual blocks in the pixel domain. Further, as described above, whether a particular transform (or type of particular transform) is performed may be dependent on an intra prediction mode. As illustrated in FIG. 6, reconstructed residual data may be provided to summer 412. Summer 412 may add reconstructed residual data to a predictive video block and generate reconstructed video data. A predictive video block may be determined according to a predictive video technique (e.g., intra prediction and inter frame prediction).

Intra prediction processing unit 408 may be configured to receive intra prediction syntax elements and retrieve a predictive video block from reference buffer 416. Reference buffer 416 may include a memory device configured to store one or more frames of video data. Intra prediction syntax elements may identify an intra prediction mode, such as the intra prediction modes described above. In one example, intra prediction processing unit 308 may reconstruct a video block using according to one or more of the intra prediction coding techniques described herein. Inter prediction processing unit 410 may receive inter prediction syntax elements and generate motion vectors to identify a prediction block in one or more reference frames stored in reference buffer 416. Inter prediction processing unit 410 may produce motion compensated blocks, possibly performing interpolation based on interpolation filters. Identifiers for interpolation filters to be used for motion estimation with sub-pixel precision may be included in the syntax elements. Inter prediction processing unit 410 may use interpolation filters to calculate interpolated values for sub-integer pixels of a reference block. Filter unit 414 may be configured to perform filtering on reconstructed video data. For example, filter unit 414 may be configured to perform deblocking and/or SAO filtering, as described above with respect to filter unit 216. Further, it should be noted that in some examples, filter unit 414 may be configured to perform a proprietary discretionary filter (e.g., visual enhancements). As illustrated in FIG. 6, a reconstructed video block may be output by video decoder 400.

In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium, such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can include RANI, ROM, EEPROM, CD-ROM, or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transitory media, but are instead directed to non-transitory, tangible storage media. Disk and disc, as used herein, includes compact disc (CD), laser disc, optical disc, digital versatile disc (DVD), floppy disk, and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general-purpose microprocessors, application-specific integrated circuits (ASICs), field-programmable logic arrays (FPGAs), or other equivalent integrated or discrete logic circuitry. Accordingly, the term "processor," as used herein, may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC), or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Moreover, each functional block or various features of the base station device and the terminal device used in each of the aforementioned embodiments may be implemented or executed by a circuitry, which is typically an integrated circuit or a plurality of integrated circuits. The circuitry designed to execute the functions described in the present specification may include a general-purpose processor, a digital signal processor (DSP), an application-specific or general application integrated circuit (ASIC), a field-programmable gate array (FPGA), or other programmable logic devices, discrete gates or transistor logic, or a discrete hardware component, or a combination thereof. The general-purpose processor may be a microprocessor, or alternatively, the processor may be a conventional processor, a controller, a microcontroller, or a state machine. The general-purpose processor or each circuit described above may be configured by a digital circuit or may be configured by an analogue circuit. Further, when a technology of making into an integrated circuit superseding integrated circuits at the present time appears due to advancement of a semiconductor technology, the integrated circuit by this technology is also able to be used.

Various examples have been described. These and other examples are within the scope of the following claims.

What is claimed is:

1. A method for updating a probability estimator value during entropy decoding for a bitstream representing a set of video pictures, the method comprising:
    updating the probability estimator value by (i) performing an initial right bit-shifting operation on the probability estimator value to reduce a length, in bits, of the probability estimator value, (ii) multiplying the right bit-shifted probability estimator value by a range value representing an interval, (iii) performing another right bit-shifting operation on a result of the multiplication generated by multiplying the right bit-shifted probability estimator value by the range value, and (iv) adding a constant value to a result of the other right bit-shifting operation, wherein the probability estimator value is associated with a probability of a bin having a particular value.

2. The method of claim 1, wherein an amount by which the result of the multiplication is right bit-shifted in the other right bit-shifting operation is based on an amount by which the probability estimator value is right bit-shifted in the initial right bit-shifting operation.

3. The method of claim 2, wherein the amount by which the result of the multiplication is right bit-shifted in the other right bit-shifting operation is equal to a constant minus the amount by which the probability estimator value is right bit-shifted in the initial right bit-shifting operation.

4. The method of claim 1, wherein the probability estimator value is further associated with a current bin value being equal to a least probable state for the current bin value.

5. The method of claim 4, wherein 1 minus the probability estimator value is right bit-shifted and multiplied by the range value representing the interval when the current bin value is equal to a most probable state for the current bin value.

6. The method of claim 1, further comprising updating the probability estimator value further based on a current bin value.

7. The method of claim 6, wherein updating the probability estimator value based on the current bin value comprises applying a bit-shifting operation to a value based on the probability estimator value.

8. The method of claim 1, wherein if the updated probability estimator value exceeds a threshold, a most probable state for a subsequent bin value is modified.

9. The method of claim 8, wherein if the most probable state for the subsequent bin value is modified, the updated probability estimator value is also modified.

10. The method of claim 9, wherein the updated probability estimator value is modified by inverting each bit of the updated probability estimator value.

11. The method of claim 1, further comprising:
updating the interval based on the right bit-shifted probability estimator value;
determining whether the updated interval is smaller than a threshold value; and
when the updated interval is smaller than the threshold value, renormalizing the updated interval.

12. The method of claim 11, wherein renormalizing the updated interval comprises doubling the updated interval.

13. An electronic device for updating a probability estimator value during entropy decoding for a bitstream representing a set of video pictures, the electronic device comprising:
at least one processor; and
at least one non-transitory computer-readable medium coupled to the at least one processor and storing one or more computer-executable instructions which, when executed by the at least one processor, cause the electronic device to:
update the probability estimator value by (i) performing an initial right bit-shifting operation on the probability estimator value to reduce a length, in bits, of the probability estimator value, (ii) multiplying the right bit-shifted probability estimator value by a range value representing an interval, (iii) performing another right bit-shifting operation on a result of the multiplication generated by multiplying the right bit-shifted probability estimator value by the range value, and (iv) adding a constant value to a result of the other right bit-shifting operation, wherein the probability estimator value is associated with a probability of a bin having a particular value.

14. The electronic device of claim 13, wherein an amount by which the result of the multiplication is right bit-shifted in the other right bit-shifting operation is based on an amount by which the probability estimator value is right bit-shifted in the initial right bit-shifting operation.

15. The electronic device of claim 14, wherein the amount by which the result of the multiplication is right bit-shifted in the other right bit-shifting operation is equal to a constant minus the amount by which the probability estimator value is right bit-shifted in the initial right bit-shifting operation.

16. The electronic device of claim 13, wherein:
the probability estimator value is further associated with a current bin value being equal to a least probable state for the current bin value, and
1 minus the probability estimator value is right bit-shifted and multiplied by the range value representing the interval when the current bin value is equal to a most probable state for the current bin value.

17. The electronic device of claim 13, wherein the one or more computer-executable instructions, when executed by the at least one processor, further cause the electronic device to:
update the probability estimator value further based on a current bin value.

18. The electronic device of claim 17, wherein updating the probability estimator value based on the current bin value comprises applying a bit-shifting operation to a value based on the probability estimator value.

19. The electronic device of claim 13, wherein:
if the updated probability estimator value exceeds a threshold, a most probable state for a subsequent bin value is modified,
if the most probable state for the subsequent bin value is modified, the updated probability estimator value is also modified, and
the updated probability estimator value is modified by inverting each bit of the updated probability estimator value.

20. The electronic device of claim 13, wherein the one or more computer-executable instructions, when executed by the at least one processor, further cause the electronic device to:
update the interval based on the right bit-shifted probability estimator value;
determine whether the updated interval is smaller than a threshold value; and
when the updated interval is smaller than the threshold value, renormalize the updated interval, wherein renormalizing the updated interval comprises doubling the updated interval.

* * * * *